(12) United States Patent
Wang et al.

(10) Patent No.: US 11,605,719 B2
(45) Date of Patent: Mar. 14, 2023

(54) GATE STRUCTURE WITH DESIRED PROFILE FOR SEMICONDUCTOR DEVICES

(71) Applicant: Taiwan Semiconductor Manufacturing Co., Ltd., Hsinchu (TW)

(72) Inventors: Chih Ping Wang, Hsinchu (TW); Chao-Cheng Chen, Hsinchu (TW); Jr-Jung Lin, Hsinchu (TW); Chi-Wei Yang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 187 days.

(21) Appl. No.: 16/992,899

(22) Filed: Aug. 13, 2020

(65) Prior Publication Data

US 2020/0373401 A1 Nov. 26, 2020

Related U.S. Application Data

(62) Division of application No. 15/920,866, filed on Mar. 14, 2018, now Pat. No. 10,749,007.

(51) Int. Cl.
| | |
|---|---|
| *H01L 29/423* | (2006.01) |
| *H01L 21/3213* | (2006.01) |
| *H01L 29/78* | (2006.01) |
| *H01L 29/66* | (2006.01) |
| *H01L 29/417* | (2006.01) |

(52) U.S. Cl.
CPC .. *H01L 29/42376* (2013.01); *H01L 21/32135* (2013.01); *H01L 29/66795* (2013.01); *H01L 29/785* (2013.01); *H01L 29/7851* (2013.01); *H01L 29/41791* (2013.01)

(58) Field of Classification Search
CPC .............. H01L 29/785; H01L 29/7853; H01L 2029/7858
See application file for complete search history.

(56) References Cited

U.S. PATENT DOCUMENTS

| | | | | |
|---|---|---|---|---|
| 5,093,791 | A * | 3/1992 | Schneider | ................. H02P 5/56 416/34 |
| 5,115,492 | A * | 5/1992 | Engeler | ................ G06N 3/0481 708/3 |
| 9,093,530 | B2 | 7/2015 | Huang et al. | |
| 9,171,929 | B2 | 10/2015 | Lee et al. | |
| 9,214,555 | B2 | 12/2015 | Oxland et al. | |

(Continued)

FOREIGN PATENT DOCUMENTS

| | | |
|---|---|---|
| CN | 104752508 A | 7/2015 |
| CN | 105655392 A | 6/2016 |

(Continued)

*Primary Examiner* — Changhyun Yi
(74) *Attorney, Agent, or Firm* — Slater Matsil, LLP

(57) ABSTRACT

Semiconductor device structures with a gate structure having different profiles at different portions of the gate structure may include a fin structure on a substrate, a source/drain structure on the fin structure, and a gate structure over the fin structure and along a sidewall of the fin. The source/drain structure is proximate the gate structure. The gate structure has a top portion having a first sidewall profile and a bottom portion having a second sidewall profile different from the first sidewall profile.

20 Claims, 25 Drawing Sheets

(56) References Cited

U.S. PATENT DOCUMENTS

| | | | |
|---|---|---|---|
| 9,564,489 B2 | 2/2017 | Yeo et al. | |
| 9,601,342 B2 | 3/2017 | Lee et al. | |
| 9,608,116 B2 | 3/2017 | Ching et al. | |
| 9,716,161 B2 | 7/2017 | Cheng et al. | |
| 2015/0187946 A1 | 7/2015 | Park et al. | |
| 2015/0318398 A1* | 11/2015 | Xie | H01L 29/1608 257/288 |
| 2015/0340475 A1* | 11/2015 | Lin | H01L 21/311 438/283 |
| 2016/0071980 A1 | 3/2016 | Chang et al. | |
| 2016/0093537 A1* | 3/2016 | Chen | H01L 21/32136 438/283 |
| 2016/0111531 A1 | 4/2016 | Dong | |
| 2016/0254385 A1 | 9/2016 | Wen et al. | |
| 2017/0005165 A1* | 1/2017 | Chen | H01L 29/7856 |
| 2017/0098711 A1 | 4/2017 | Hsiao et al. | |
| 2017/0330955 A1 | 11/2017 | Rahhal-Orabi et al. | |
| 2020/0357655 A1 | 11/2020 | Chen et al. | |

FOREIGN PATENT DOCUMENTS

| | | |
|---|---|---|
| CN | 106328692 A | 1/2017 |
| CN | 106560931 A | 4/2017 |
| CN | 107004708 A | 8/2017 |
| KR | 20070069814 A | 7/2007 |
| TW | 201611285 A | 3/2016 |

* cited by examiner

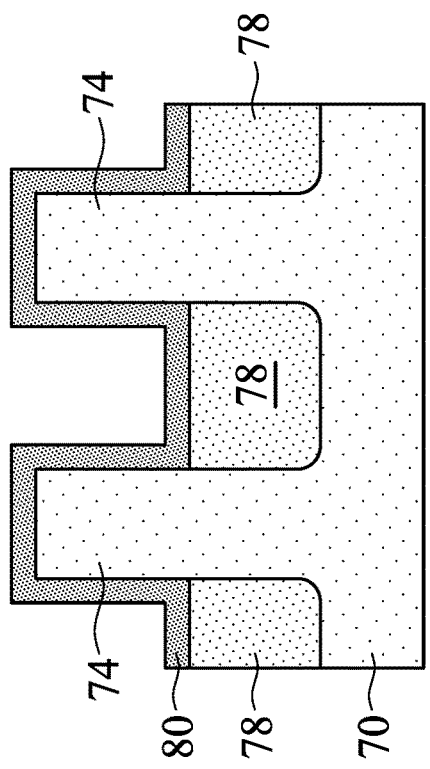
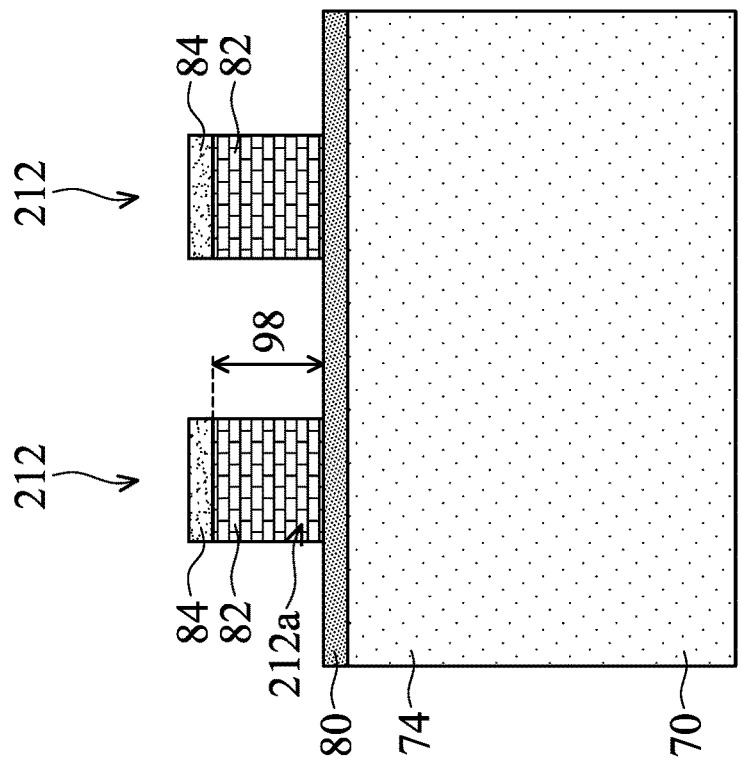
FIG. 6B
FIG. 6A

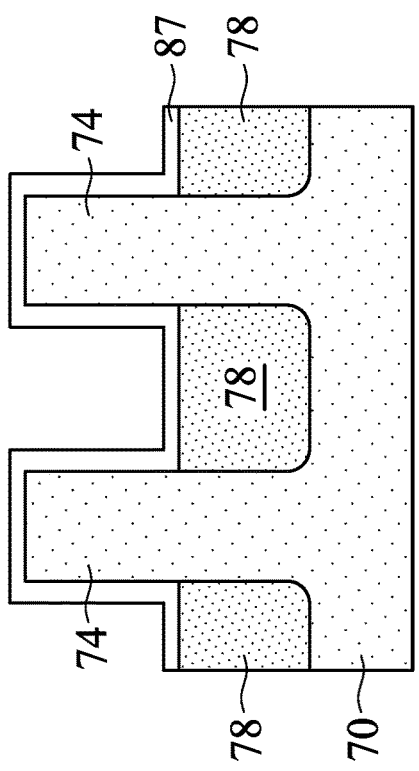
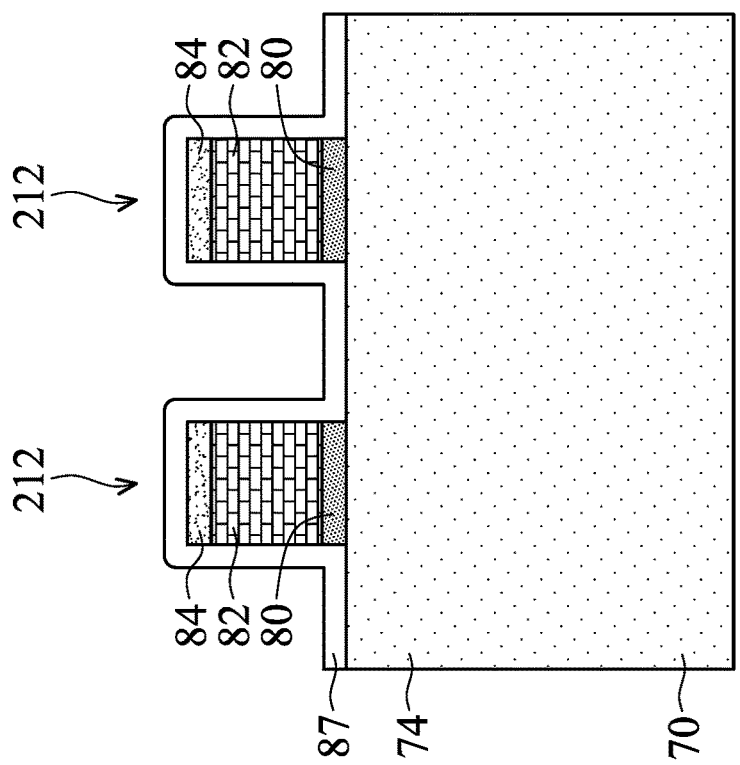
FIG. 8B
FIG. 8A

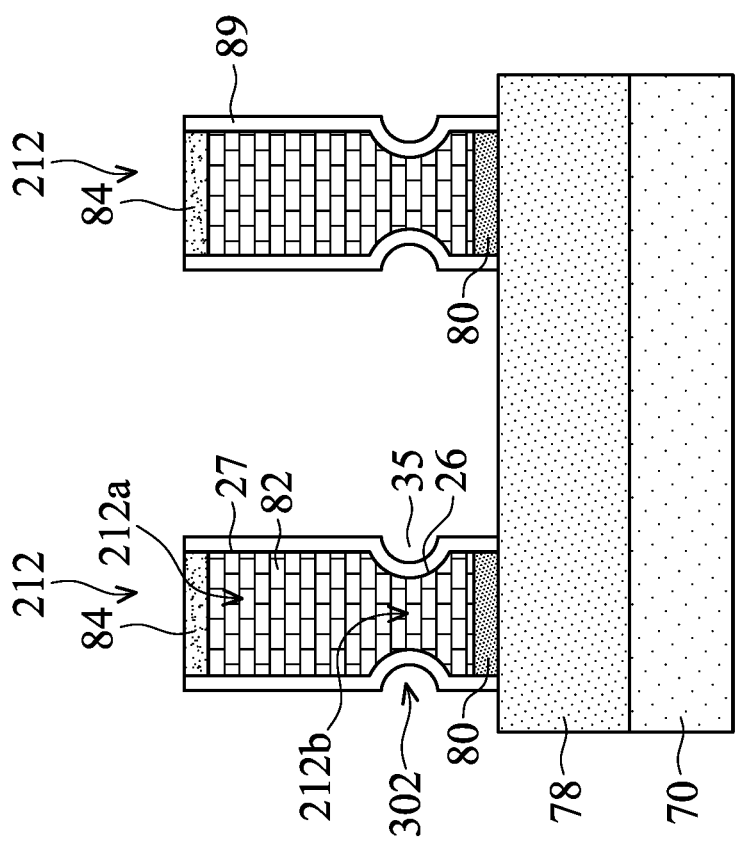

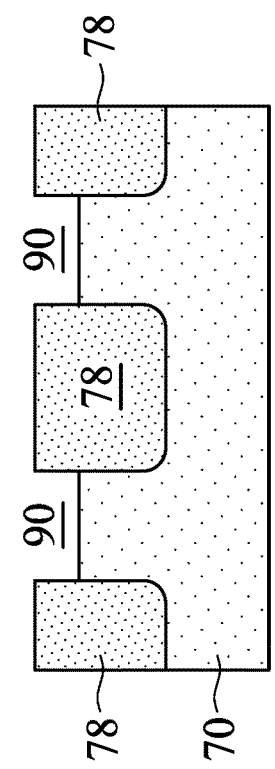
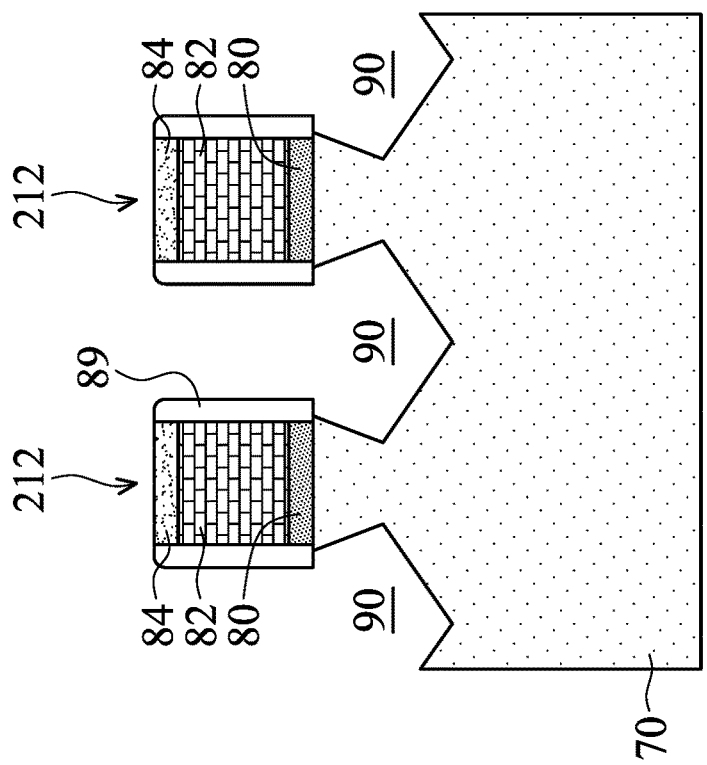
FIG. 10B
FIG. 10A

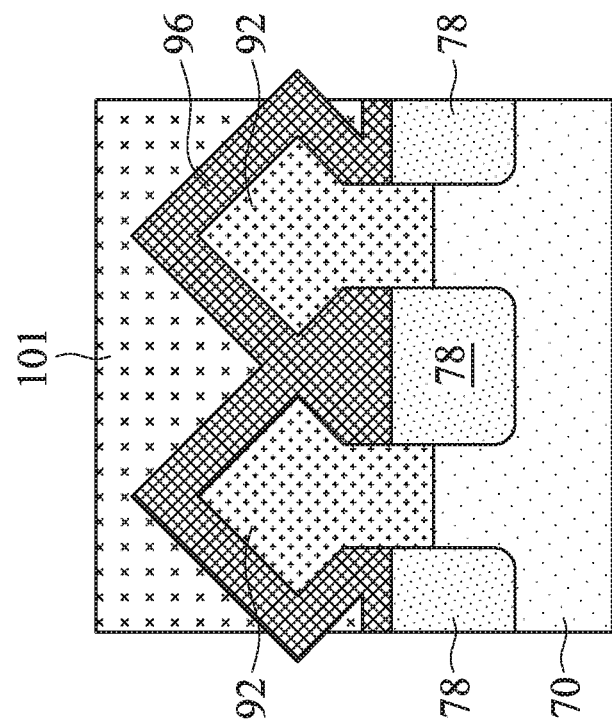
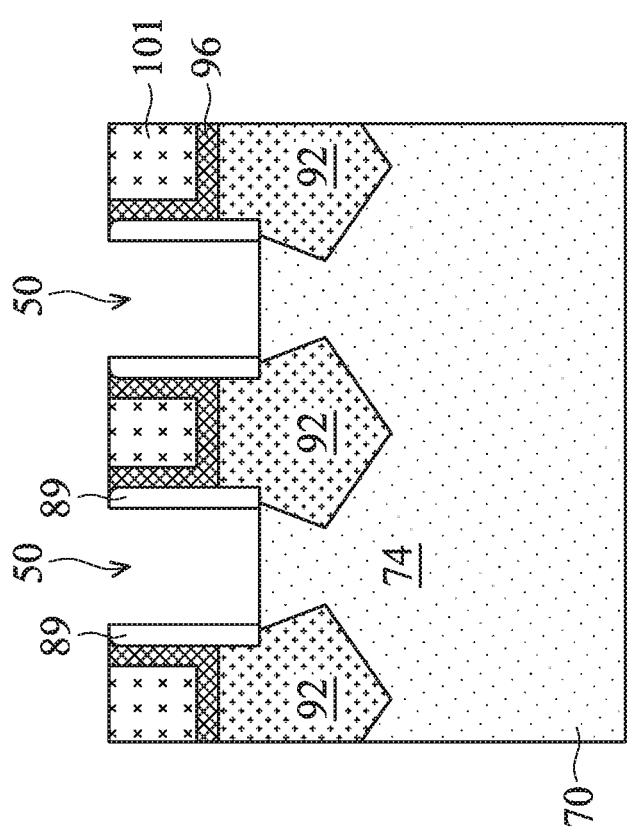
FIG. 13A
FIG. 13B

GATE STRUCTURE WITH DESIRED PROFILE FOR SEMICONDUCTOR DEVICES

PRIORITY CLAIM AND CROSS REFERENCE

This application is a divisional of U.S. patent application Ser. No. 15/920,866 filed on Mar. 14, 2018, entitled "Gate Structure with Desired Profile for Semiconductor Devices," which application is hereby incorporated herein by reference.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel underlying the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is implementing a replacement-gate process (also called as a "gate-last" process) in which the final gate stack is fabricated "last". However, there are challenges to implement such IC fabrication processes in advanced process nodes with small dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C, 4A-4C, 5A-5C, 6A-6C, 7A-7C, 8A-8C, 9A-9C, 10A-10C, 11A-11C, 12A-12C, 13A-13C, and 14A-14C depict cross-sectional views of the semiconductor device structure at different manufacturing stages of FIG. 1 in accordance with some embodiments.

DETAILED DESCRIPTION

Figure 1:
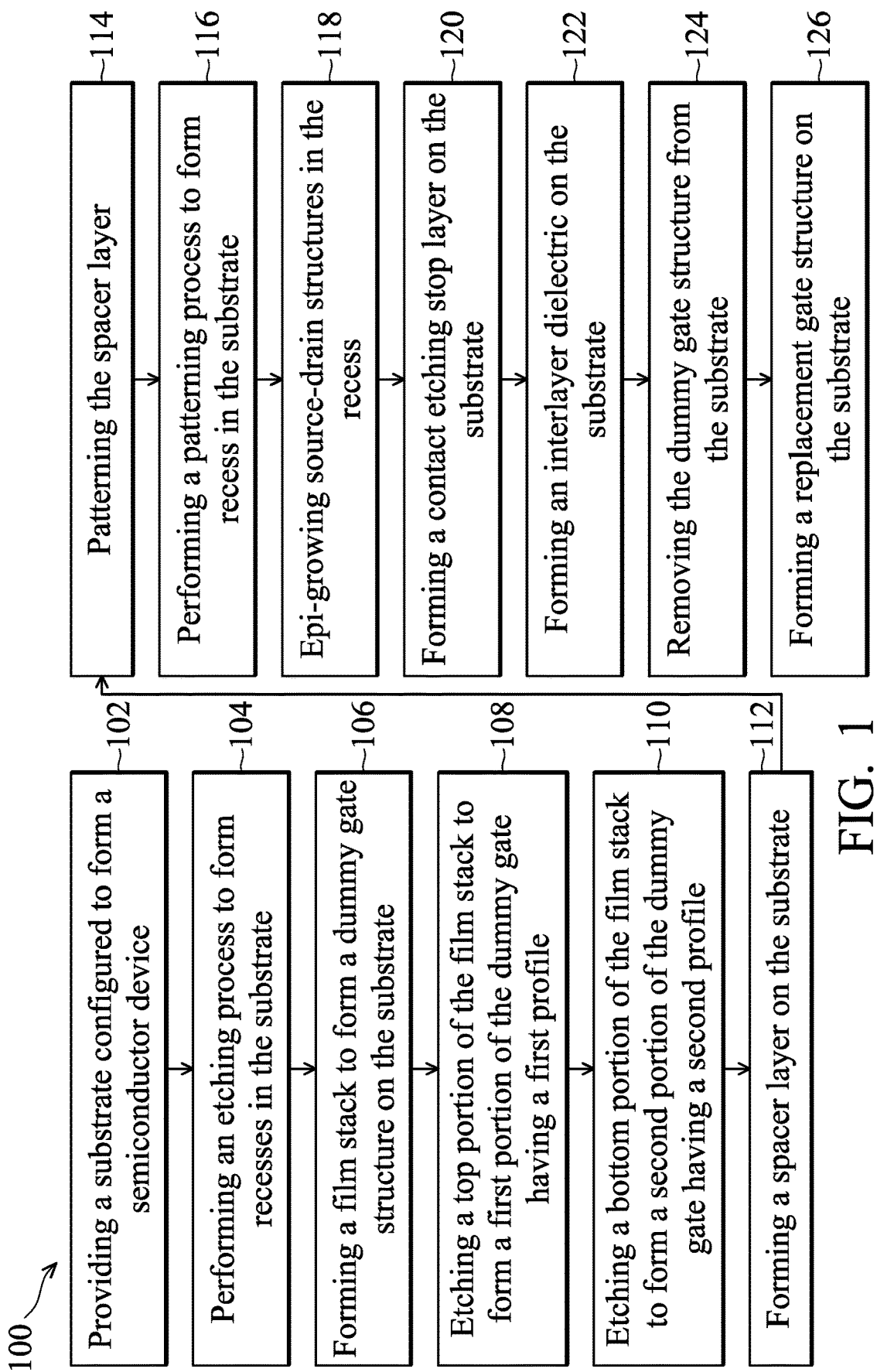
FIG. 1 is a flow chart of an example process for manufacturing a device structure on a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gate structures formed in semiconductor devices. The present disclosure provides methods for manufacturing a gate structure with a desired profile so that the gate structure may be maintained a desired distance to the nearby structures, such as source/drain structures, after the replacement gate process is completed. In some examples, the gate structure may include a top portion and a bottom portion with different profiles. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In a replacement gate process for forming a replacement gate structure for a transistor, a dummy gate stack is formed over a substrate as a placeholder for an gate structure later formed thereon. A spacer structure is formed along the dummy gate stack. After source/drain structures, a contact etch stop layer (CESL), and an interlayer dielectric (ILD) layer are formed, the dummy gate stack is removed, leaving an opening defined by the spacer structure, CESL and/or ILD layer. Then, a replacement gate structure is formed in the opening defined by the spacer structure, CESL, and/or ILD.

The replacement gate structure can include a gate dielectric layer, such as a high-k dielectric layer, an optional barrier layer, a work-function tuning layer, and a gate metal fill. Multiple deposition and patterning processes may be used to form the work-function tuning layer, for example, to fine tune threshold voltage (Vt) of the transistor. In some embodiments, the work-function tuning layer may utilize different materials for different types of transistors, such as p-type FinFET or n-type FinFET, so as to enhance device electrical performance as needed.

Figure 2:
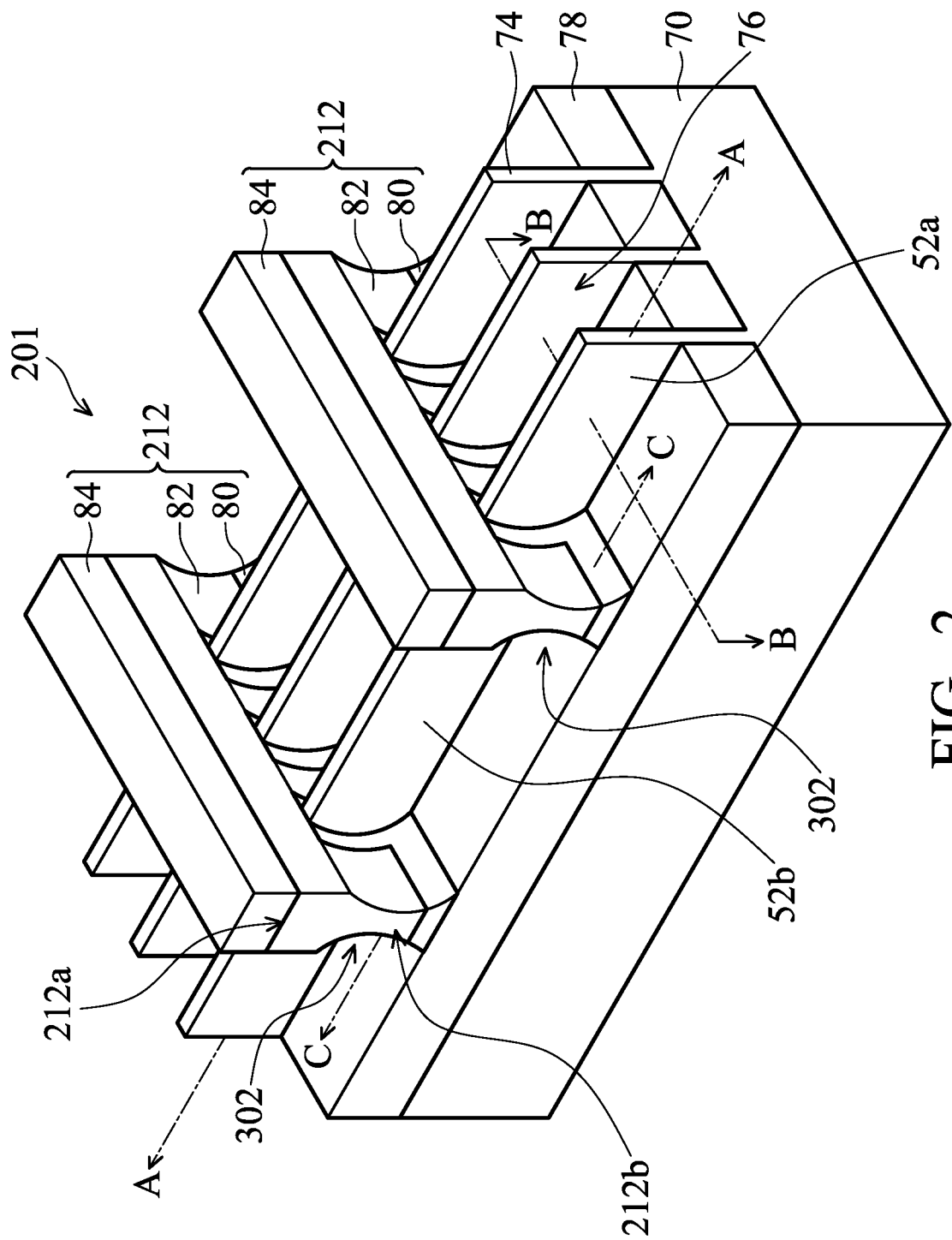
FIG. 2 depicts a perspective view of a semiconductor device structure in accordance with some embodiments.

FIG. 1 depicts an exemplary flow diagram of a process 100 performed to form a semiconductor device structure, such as a simplified FinFET device structure 201 depicted in FIG. 2 in accordance with some embodiments. Other aspects not illustrated in or described with respect to FIG. 2 may become apparent from the following figures and description. FIGS. 3A-14C are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2-14C or other semiconductor structures not presented herein.

The simplified FinFET device structure 201 depicted in FIG. 2 includes fin structures 74 on a substrate 70 and between and protruding above isolation structures 78 in recesses 76 that define the fin structures 74. Each fin structure 74 provides an active region where one or more devices are formed. Dummy gate structures 212 are formed over and extending perpendicularly to the fin structures 74. Source/drain regions 52a and 52b are disposed in opposing regions of each fin structure 74 with respect to the corresponding dummy gate structure 212.

In the example depicted in FIG. 2, the dummy gate structures 212 each include an interfacial dielectric 80, a dummy gate layer 82 over the interfacial dielectric 80, and a hard mask 84 over the dummy gate layer 82. The dummy gate structure 212 engages the fin structures 74 on two or three sides of the fin structure 74. Each dummy gate structure 212 has a top portion 212a having a first profile and a bottom portion 212b having a second profile. Different profiles of the dummy gate structures 212 formed at different portions, such as the top and bottom portions 212a, 212b, may help modulate electrical performance of the semiconductor devices for different purposes. For example, the second profile of the bottom portion 212b provides a non-linear surface having a side curvature, which is believed to provide a wider processing window when forming other structures located nearby the dummy gate structure 212. In the embodiment depicted in FIG. 2, the second profile of the bottom portion 212b includes a hyperbolic surface different from the first profile, such as a sidewall vertical straight profile, in the top portion 212a so as to modulate the electrical characteristics and performance of the semiconductor devices after the final gate structure is completed. Details regarding the second profile of the bottom portion 212b will be further discussed below.

It is noted that the hyperbolic surface (e.g., or called non-linear surface) at the bottom portion 212b of the dummy gate structure 212 alters the distance and/or space between the dummy gate structure 212 and the nearby structures, such as the source/drain structures formed in the source/drain regions 52a, 52b, as compared to the top portion 212a. Thus, by utilizing the non-linear surface at the bottom portion 212b of the dummy gate structure 212, small spaces at the nearby area may be increased and enlarged, thus providing a wider process window when manufacturing other structures nearby, e.g., providing an enlarged space for the growth of the source/drain structures in the source/drain regions 52a, 52b.

FIG. 2 further illustrates reference cross-sections that are used in later figures. Cross-section A-A is in a plane along channels in the fin structure 74 between opposing source/drain regions 52a, 52b. Cross-section B-B is in a plane perpendicular to cross-section A-A and is across source/drain regions 52a in neighboring fin structures 74. Cross-section C-C is in a plane parallel to the cross-section A-A along the recesses 76 and the isolation structure 78 between the fin structures 74. Subsequent figures refer to these reference cross-sections for clarity. The following figures ending with an "A" designation illustrate cross-sectional views at various instances of processing corresponding to cross-section A-A; the following figures ending with a "B" designation illustrate cross-sectional views at various instances of processing corresponding to cross-section B-B; and the following figures ending with a "C" designation illustrate cross-sectional views at various instances of processing corresponding to cross-section C-C. In some figures, some reference numbers of components or features illustrated therein may be omitted to avoid obscuring other components or features; this is for ease of depicting the figures.

Referring back to the process 100 depicted in FIG. 1, the process 100 begins at operation 102 by providing the substrate 70, ready for manufacturing a semiconductor device, such as the semiconductor device 201, to be formed on the substrate 70. The substrate 70 can be or include a bulk semiconductor substrate, a semiconductor-on-insulator (SOI) substrate, or another substrate. The semiconductor material of the substrate 70 can include or be an elemental semiconductor like silicon (e.g., crystalline silicon like Si<100> or Si<111>) or germanium, a compound or alloy semiconductor, the like, or a combination thereof. The semiconductor material may be doped or undoped, such as with a p-type or an n-type dopant.

Figure 3B:
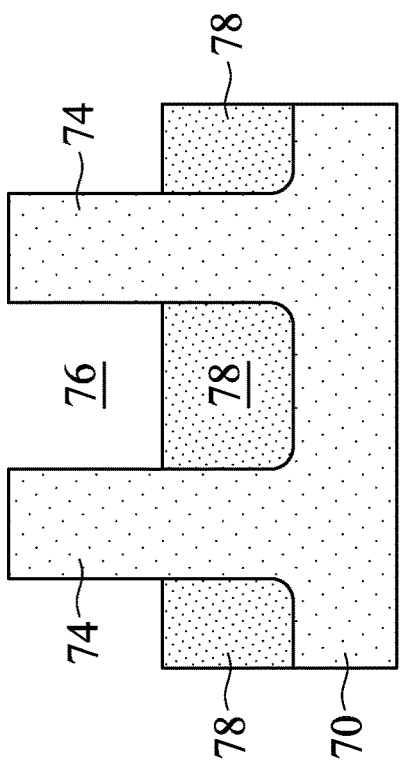
Figure 3A:
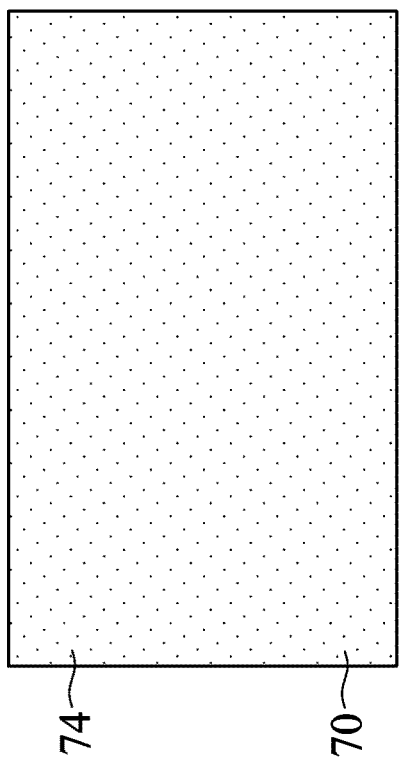
Figure 3C:
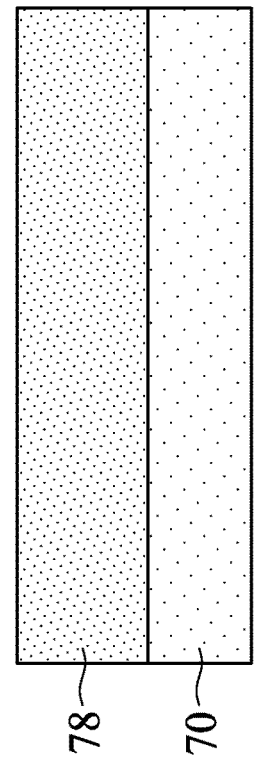

At operation 104, fin structures 74 are formed on the substrate 70 and extending from between isolation structures 78, as shown in FIGS. 3A-C. The fin structures 74 are formed using suitable processes, including masking, photolithography, and/or etch processes, to form recesses 76 in the substrate 70 defining the fin structures 74 in the substrate 70. In some examples, the fin structures 74 can be or comprise an elementary semiconductor such as silicon or germanium, a compound or alloy semiconductor; the like; or a combination thereof. Further, the fin structures 74 may be doped using n-type and/or p-type dopants as needed.

The isolation structures 78 are formed in the recesses 76. The isolation structure 78 may include or be an insulating material such as an oxide (such as silicon oxide), a nitride, the like, or a combination thereof, and the insulating material may be deposited using any suitable deposition process. The insulating material may then be recessed to form the isolation structure 78 with the fin structures 74 protruding from between neighboring isolation structures 78. The insulating material may be recessed using an acceptable etch process, such as one that is selective to the material of the insulating material. Numerous other embodiments of methods to form a fin structure and/or isolation structure on a substrate may be utilized.

Figure 4B:
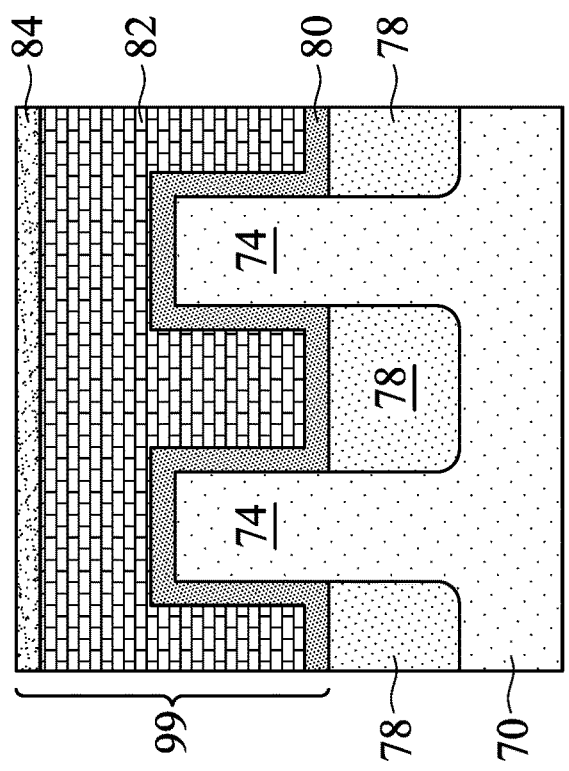
Figure 4A:
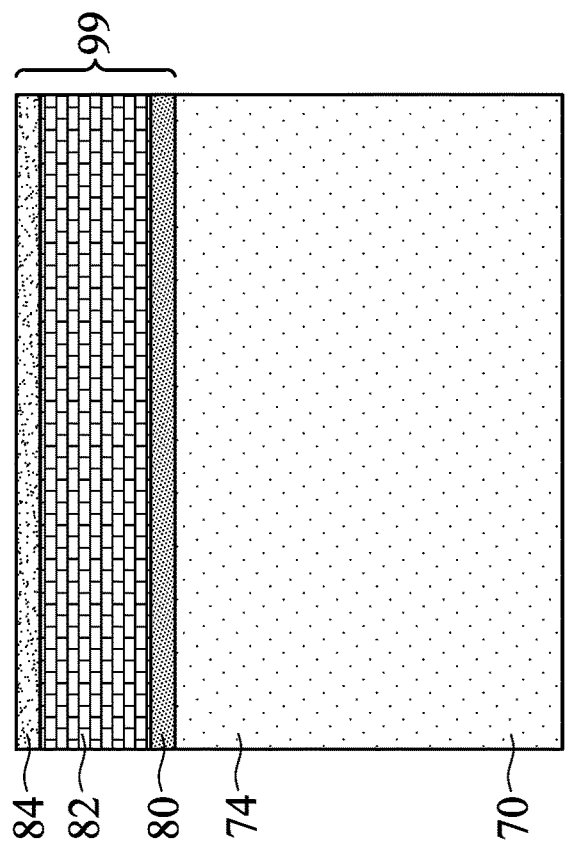
Figure 4C:
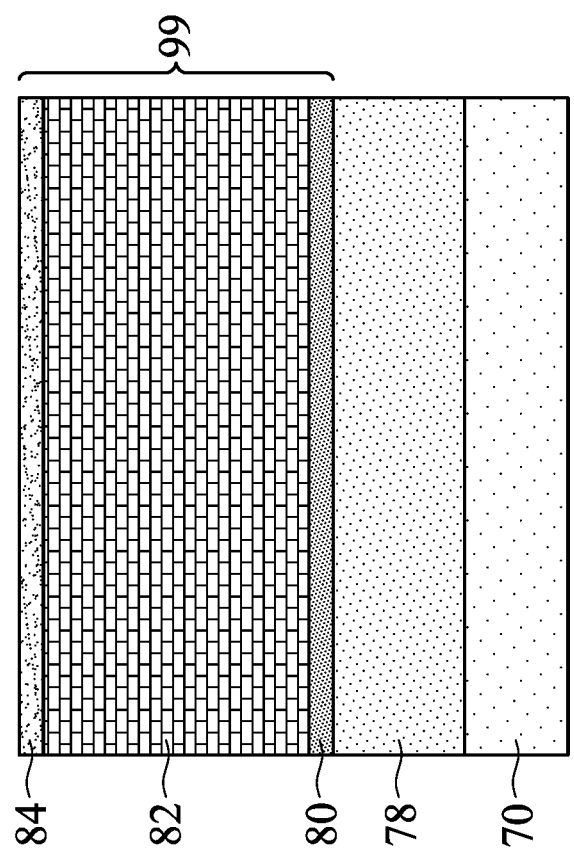

At operation 106, a film stack 99 is formed on the substrate, as depicted in FIGS. 4A-4C, which may be later utilized to form a dummy gate structure 212. The film stack 99 is formed as blanket layers over the fin structure 74. The film stack 99 comprises an interfacial dielectric 80 over the fin structures 74, a dummy gate layer 82 over the interfacial dielectric 80, and a hard mask 84 over the dummy gate layer 82.

The interfacial dielectric 80, the dummy gate layer 82 and the hard mask 84 may be formed by sequentially forming respective layers, and then patterning those layers to form the dummy gate structure 212 with desired profiles. For example, the interfacial dielectric 80 may include or be silicon oxide, silicon nitride, the like, or multilayers thereof, and may be thermally and/or chemically grown on the fin structure 74, or conformally deposited, such as by plasma enhanced chemical vapor deposition (PECVD), atomic layer deposition (ALD), or another deposition technique. The dummy gate layer 82 may include or be silicon (e.g., amorphous silicon and/or polysilicon) or another material deposited by low pressure chemical vapor deposition (LPCVD), PECVD, physical vapor deposition (PVD), or another deposition technique. The interfacial dielectric 80 and the dummy gate layer 82 may be first formed on the substrate until at least the recesses 76 defined between the fin structures 74 are filled with the dummy gate layer 82 and with a desired thickness of the dummy gate layer 82. A chemical mechanical planarization (CMP) process may be utilized to planarize the dummy gate layer 82 prior to forming the hard mask 84. Thus, after the recesses 76 are filled and planarized, the dummy gate layer 82 is obtained, and the hard mask 84 is then formed thereon. The hard mask 84 may include or be silicon nitride, silicon oxynitride, silicon carbon nitride, the like, or a combination thereof, deposited by chemical vapor deposition (CVD), PVD, ALD, or another deposition technique. The hard mask 84 may then be patterned, for example, using photolithography and one or more etch processes.

Figure 5A:
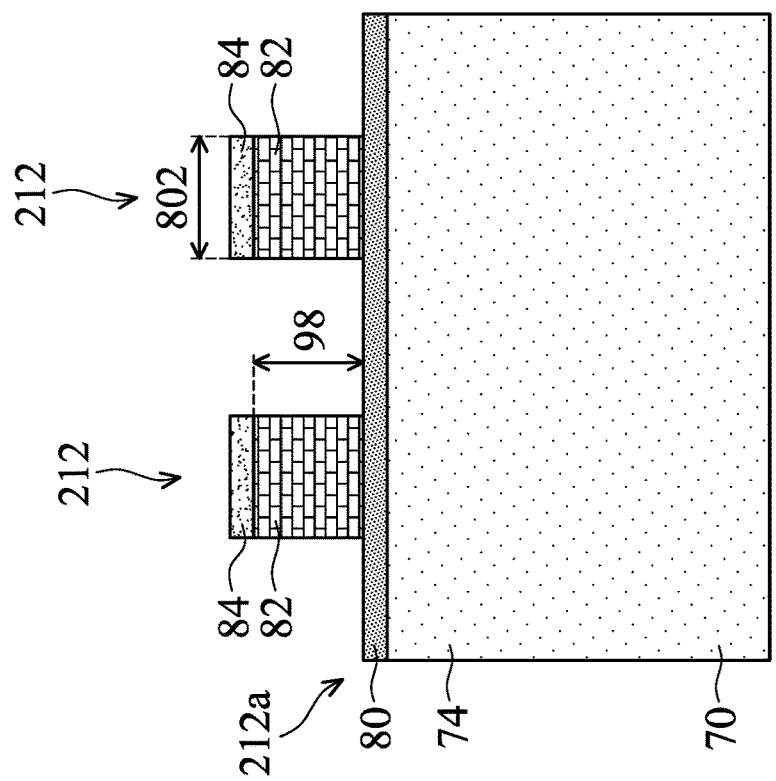
Figure 5B:
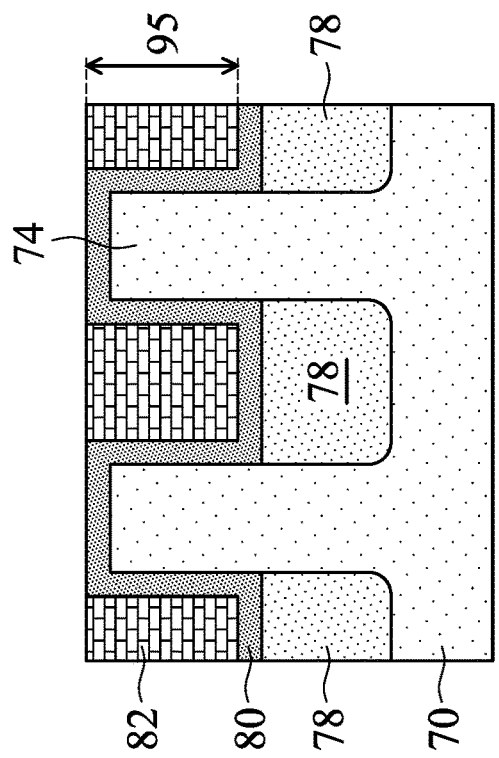
Figure 5C:
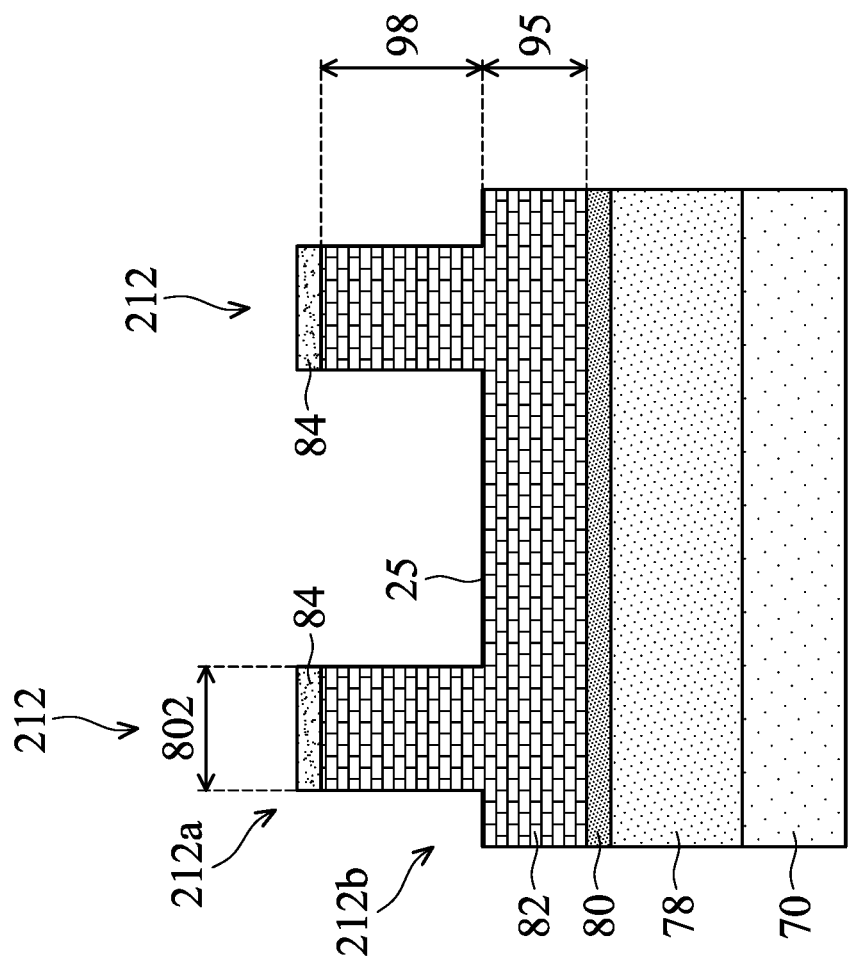

At operation 108, an etching process is performed to etch a top portion of the film stack 99, as shown in FIG. 5A-5C. The etching process is an anisotropic etching process to directionally etch a top portion of the film stack 99, forming the top portion 212a of the dummy gate structure 212. The top portion 212a of the dummy gate structure 212 comprises a portion of the film stack 99 at and above a level of a top surface of the fin structure 74, as shown in FIG. 5A with a first depth 98. In other words, the top portion 212a refers to the portion of the dummy gate structure 212 at and above a horizontal plane of the top surface of the fin structure 74. The first depth 98 may be in a range from about 30 nm to 55 nm. The bottom portion 212b has a second depth 95 remaining on the substrate above the isolation structure 78 below a level of the top surface of the fin structure 74 and filling the recesses 76 defined between the fin structures 74, as shown in FIG. 5B. The second depth 95 may be similar to the height of the fin structure 74 (above the isolation structures 78) in a range from about 40 nm to 65 nm, such as about 55 nm. The first depth 98 of the top portion 212a is the depth formed above the fin structure 74, as shown in FIG. 5A. Thus, when the etching process at operation 108 ends, a portion 25 of the dummy gate layer 82 remains and is exposed between fin structures 74, as shown in FIG. 5C, which will be further etched in the following operations.

As the etching process utilized to etch the top portion 212a is an anisotropic etching process, the profile of the top portion 212a maintains a substantially vertical sidewall and/or linear profile having a constant width 802 along the body of the top portion 212a without significant sidewall curvature or distortion, as shown in FIGS. 5A and 5C. In some embodiments, the etching process may be a dry plasma process. The etching process is performed by supplying a first etching gas mixture including at least a halogen containing gas and a bromide containing gas. Suitable examples of the halogen containing gas include $CF_4$, $Cl_2$, HCl, $Si_2Cl_6$, $CCl_4$ the like, or a combination thereof. Suitable examples of the bromide containing gas include $Br_2$, HBr, the like, or a combination thereof. In a particular example, the first etching gas mixture include $Cl_2$ and HBr. A passivation gas may also be supplied in the etching gas mixture to assist maintaining the profile of the first portion 212a of the film stack 99. Suitable examples of the passivation gas include $O_2$, $CH_4$, $CF_4$, $N_2$, the like, or a combination thereof. The passivation gas can passivate the sidewalls of the top portion 212a during the etching process so that the sidewalls of the top portion 212a are selectively not etched during a subsequent etching process. In a particular example depicted herein, the first etching gas mixture includes $Cl_2$, HBr, and $O_2$ or $N_2$. Optionally, an inert gas, such as He and Ar, may also be supplied in the first etching gas mixture.

In some examples, the halogen containing gas and the bromide containing gas supplied in the etching gas mixture may have a ratio in a range from about 1:5 to about 1:40, such as from about 1:10 to about 1:30, for example, about 1:20. The halogen containing gas is supplied at a flow rate lower than the bromide containing gas. In some examples, the dry plasma etching process comprises a RF source power and a RF bias power. The RF source power may be in a range from about 500 Watts to about 2000 Watts, and the RF bias power may be in a range from about 100 Watts to about 3000 Watts at a frequency in a range from about 0.3 GHz to about 300 GHz for the etching process at operation 108. The RF source power and the RF bias power may be continuously supplied or pulsed at a duty cycle in a range from about 3% to about 80%. In an example, the RF source and bias power are pulsed to perform the etching process at operation 108 at a duty cycle in a range from 3% to 10%. The process pressure is controlled in a range from 30 mTorr to about 60 mTorr, such as about 45 mTorr. The plasma process duration may be controlled in a range from about 10 seconds to about 1000 seconds. The substrate temperature is controlled in a range from room temperature (e.g., about 23 degrees Celsius) to about 110 degrees Celsius, such as from about 50 degrees Celsius to about 70 degrees Celsius.

Figure 6C:
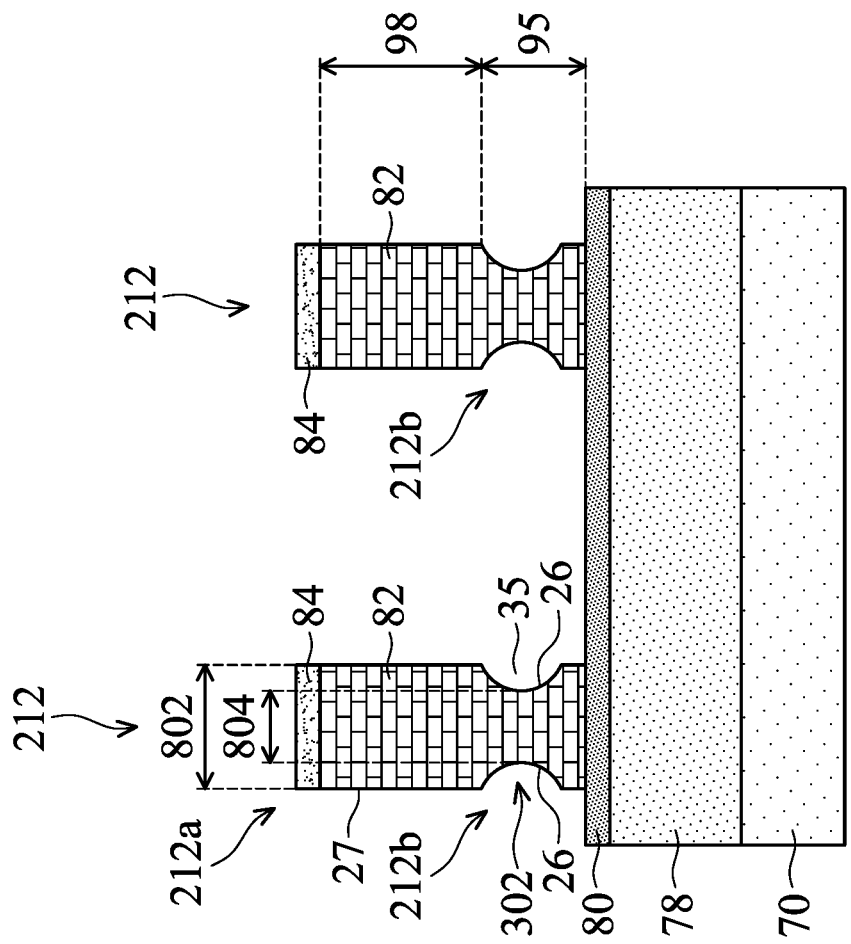

At operation 110, the etching process continues to etch the bottom portion 212b of the film stack 99 to form the dummy gate structure 212, as shown in FIGS. 6A-6C. The etching process performed at operation 110 includes a greater lateral etch component than the etching process performed at operation 108. For convenience, the etching process performed at operation 110 is referred to as an isotropic-like etching process (e.g., lateral and vertical etching components may be present in the etching process, albeit possibly unequal). The isotropic-like etching process continues to vertically etch the film stack 99 from the exposed portion 25 of the dummy gate layer 82, and also laterally etches the dummy gate layer 82, forming a non-linear surface 302 (or, as illustrated, a hyperbolic surface) in the bottom portion 202b, as shown in FIG. 6C. As the etchants from the isotropic-like etching process scatters, the etchants starts to etch the dummy gate layer 82 radially and symmetrically without specific directionality, and thus, forms the non-linear surface 302, such as a hyperbolic surface, curvature surface, half-bulb/sphere-like surface, facet surface, necking surface, notching surface, or other surfaces not planar with the vertical profile from the sidewalls of the top portion 212a.

As shown in the example depicted in FIG. 6C, the etchant starts to etch the bottom portion 212b randomly without specific directionality, resulting in the non-linear surface 302 having sidewalls 26 of the dummy gate layer 82 laterally inward from the sidewall 27 of the top portion 212a, defining a lateral recess 35. The non-linear surface 302 of the bottom portion 212b results in a shortened width 804 between the sidewalls 26 of the bottom portion 212b, as compared to the width 802 in the top portion 212a. The shortened width 804 provides additional and longer distance/space that may allow other structures formed nearby, such as source/drain structures, to have a wider process window without undesirably joining or connecting with the dummy gate structure 212. In some embodiments, the shortened width 804 in the bottom portion 212b may be in a range from about 5% to about 30% shorter than the width 802 in the top portion 212a. In some examples, the shortened width 804 is in a range from about 16 nm to about 20 nm, such as about 18.2 nm, and the width 802 is in a range from about 18 nm to about 22 nm, such as about 19.2 nm. It is noted that the shortened width 804 here refers to the shortest width formed in the bottom portion 212b of the dummy gate structure 212 while the width 802 is the widest or an average width formed in the top portion 212a of the dummy gate structure 212.

In some examples, the etching process at operation 110 is continuously performed from the etching process at operation 108 but with different process parameter settings. The process parameters controlled at operation 108 for etching the top portion 212a are different from the process parameters controlled at operation 110 so as to control the different profiles formed in the different portions for the dummy gate structure 212. The anisotropic etching at operation 108 is switched to the isotropic-like etching at operation 110 by altering the process parameters so as to alter the etchants from the vertical etching trajectory to the lateral and vertical etching trajectory. The etching processes at operations 108 and 110 may be performed in a single processing chamber or separate processing chambers. In the example that the etching processes at operations 108 and 110 are performed in the same processing chamber, the substrate may be processed without breaking vacuum, reducing the likelihood of contamination.

In some examples, the process parameters controlled at operation 110 are substantially the same with the process parameters at operation 108, except the gas flow ratio between the halogen containing gas and the bromide containing gas, the process pressure, and optionally, the RF bias power level. In some examples, the first etching gas mixture at operation 108 has a relatively high ratio of bromide containing gas compared to halogen containing gas while the second etching gas mixture at operation 110 has a relative similar gas flow rate between the halogen containing gas and the bromide containing gas (e.g., increasing the gas flow rate of halogen containing gas or decreasing the gas flow rate of the bromide containing gas in the second etching gas mixture relative to the first etching gas mixture). It is believed that the increased flow rate of the halogen containing gas in the second gas mixture provides higher ion flux of the aggressive etchants that isotropically etches the dummy gate layer 82. The relatively lower flow rate of the bromide containing gas in the second etching gas mixture, compared to the first etching gas mixture, may reduce the passivation protection during the etching process, thus assisting the lateral etching of the dummy gate layer 82 to form the non-linear surface 302 in the second portion 212b. It is believed that the bromide containing gas may react with the silicon elements from the dummy gate layer 82, forming silicon bromide complex compound ($Si_xBr_y$). The silicon bromide complex compound ($Si_xBr_y$) may further react with the oxygen gas supplied in the second gas mixture, forming silicon oxide like complex compound ($SiO_2$—Br) to protect the sidewall of the dummy gate structure 212. Thus, from decreasing the flow rate of the bromide containing gas in the second etching gas mixture, the amount/level of the passivation protection at the sidewalls is reduced, as compared to the first etching gas mixture, thus assisting the lateral etching of the dummy gate layer 82 in the second portion 212b to form the non-linear surface 302. As indicated, the first etching gas mixture passivates the sidewalls of the top portion 212a so that those sidewalls are not etched by lateral etching by the second etching gas mixture during operation 110. In some examples, the second etching gas mixture has a ratio of the halogen containing gas to the bromide containing gas supplied in the etching gas mixture in a range from about 5:1 to about 1:5, such as from 2:1 to about 1:2, for example, about 2:1.6. In some examples, the halogen containing gas is supplied in a range from about 100 sccm to about 300 sccm, such as about 180 sccm, and the bromide containing gas is supplied in a range from about 80 sccm to about 250 sccm, such as about 150 sccm.

Furthermore, the process pressure at operation 110 in the second etching gas mixture is also increased to help the lateral flow of the etchants, as compared to the process pressure in the first etching gas mixture at operation 108. In some examples, the process pressure is increased from a pressure in a range from about 30 mTorr to about 60 mTorr for operation 108 to a pressure in a range from about 60 mTorr to about 100 mTorr, such as 90 mTorr, for operation 110. It is noted that the process pressure in the second gas mixture at operation 110 may be about two times higher than the process pressure in the first gas mixture at operation 108, such as about 45 mTorr for the first gas mixture and 90 mTorr for the second gas mixture.

The RF bias power of the dry plasma etching process at operation 110 may also be tuned down to reduce the directionality of the etchants, assisting the lateral flow of the etchants for lateral and/or isotropic etching to the second portion 212b of the dummy gate structure 212. In some examples, the RF bias power in the etching process at operation 110 may be turned down about between 10% and 40% from the RF bias power from the etching process at operation 108, while the RF source power may be turned up or maintained substantially the same. The substrate temperature is maintained substantially the same in a range from room temperature (e.g., about 23 degrees Celsius) to about 110 degrees Celsius, such as from about 50 degrees Celsius to about 70 degrees Celsius.

Figure 7B:
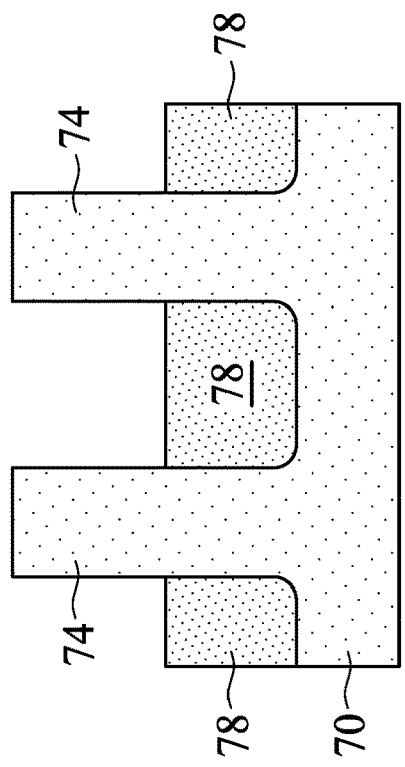
Figure 7A:
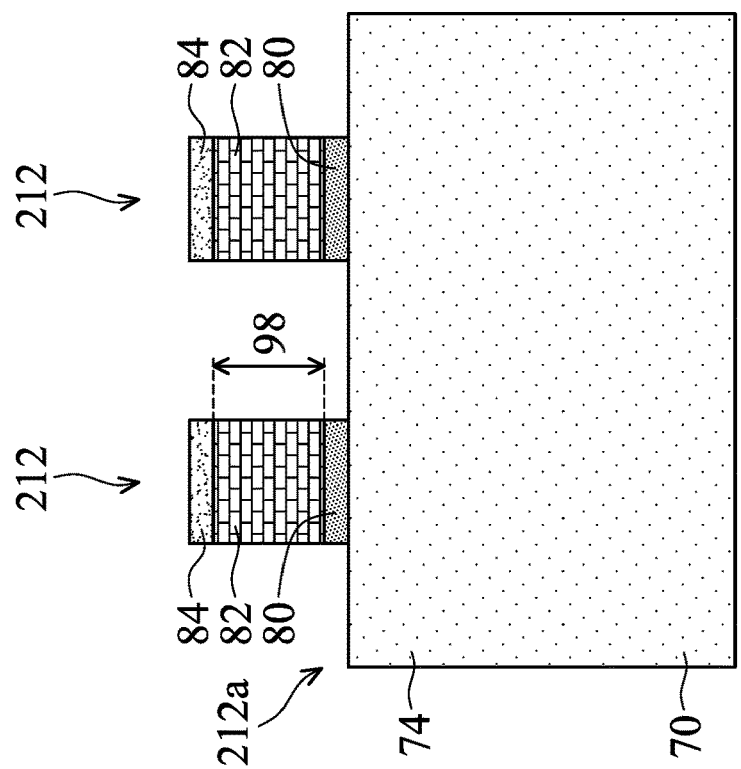
Figure 7C:
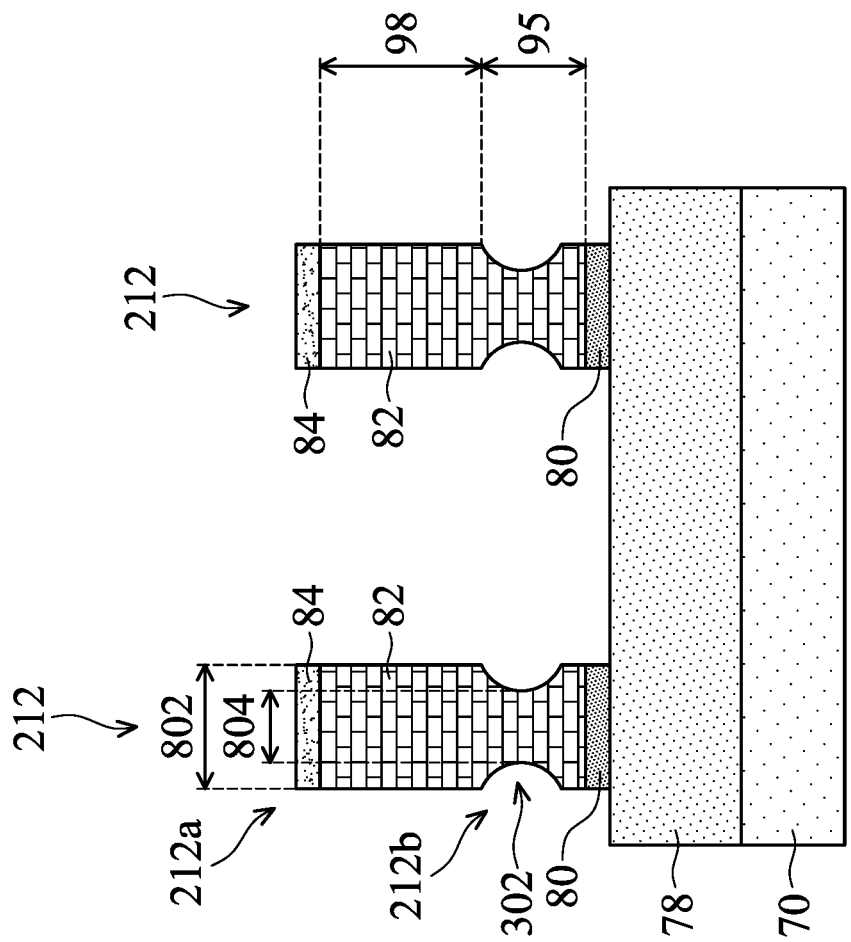

After the dummy gate layer 82 is etched, the etching process may continue to etch the interfacial dielectric 80 until it is patterned to form the structure of the dummy gate structure 212, as shown in FIGS. 7A-7C. In another embodiment, an additional etching process may be utilized to etch the interfacial dielectric 80, or the interfacial dielectric 80 can remain on the fin structures 74.

Figure 8C:
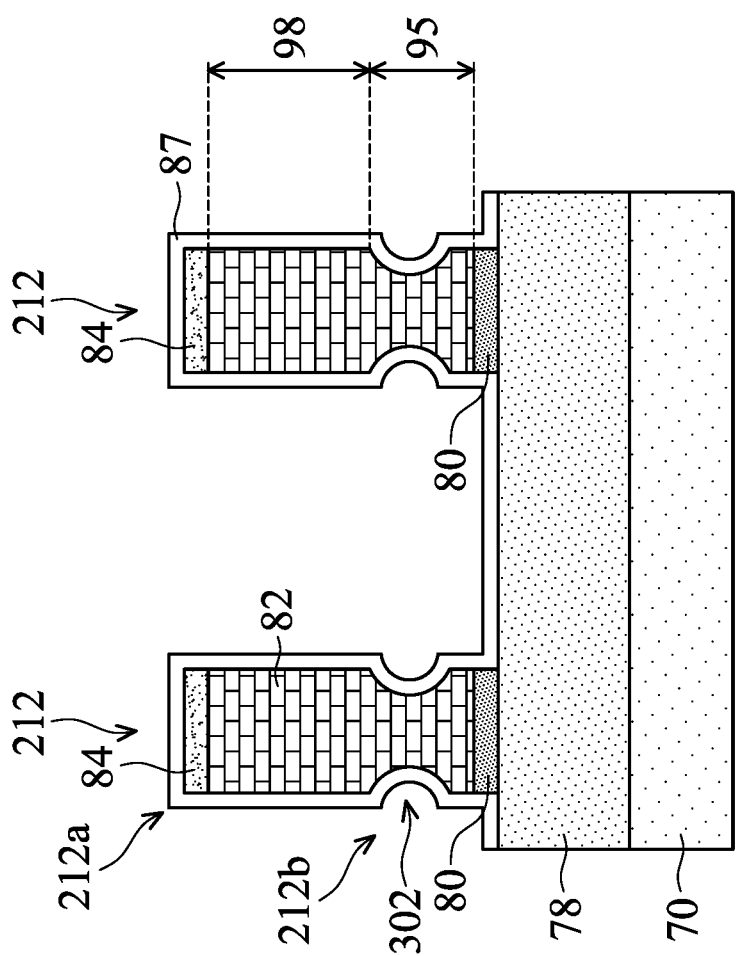

At operation 112, a spacer layer 87 is formed on sidewalls of the dummy gate structure 212, as shown in FIG. 8A-8C. The spacer layer 87 is formed conformally on the substrate 70. In some examples, the spacer layer 87 is formed from a dielectric material, such as including silicon oxycarbide (SiOC), silicon carbide, silicon nitride, silicon oxynitride, silicon oxide, and other suitable materials. In some examples, the spacer layer 87 may be formed by any suitable deposition process, such as an ALD process, CVD, or another deposition technique.

Figure 9B:
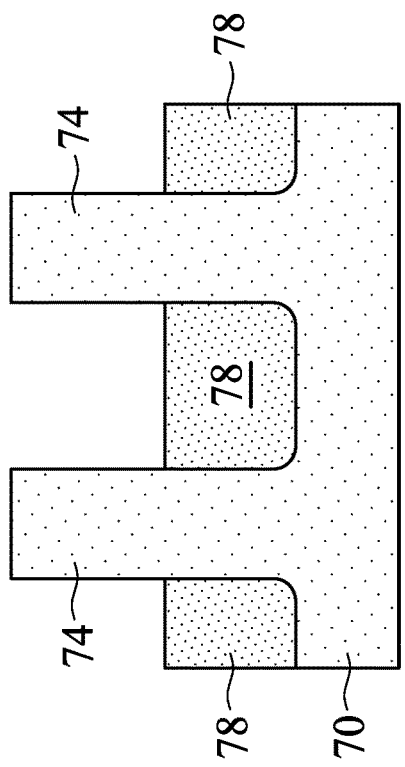
Figure 9A:
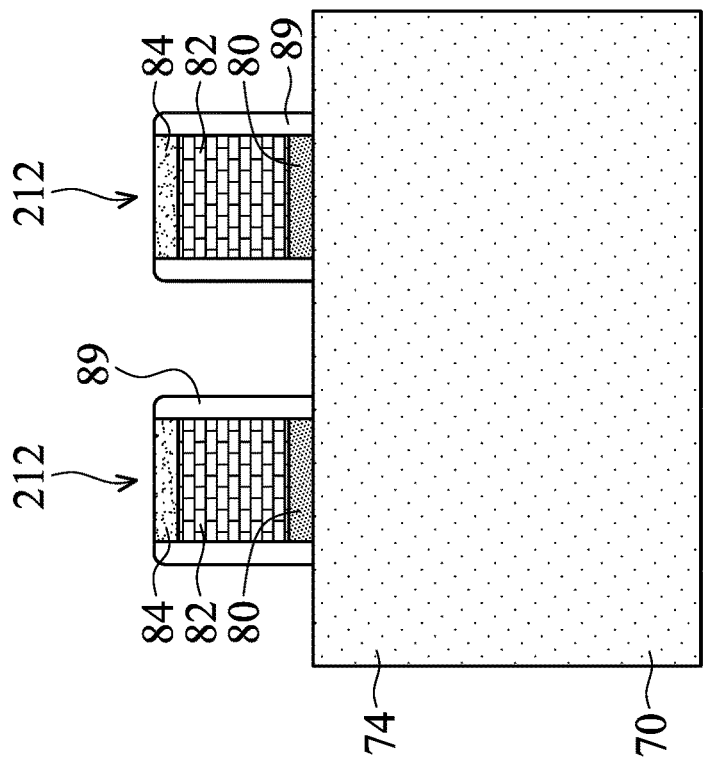

At operation 114, the spacer layer 87 is then anisotropically etched to form a desired profile, forming a spacer feature 89, as shown in FIGS. 9A-9C. The etch process can include a RIE, NBE, or another etch process. Each spacer feature 89 is formed along a sidewall of the dummy gate structure 212 from the top portion 212a extending to the bottom portion 212b. For example, each spacer feature 89 conforms to the sidewall 27 in the top portion 212a and the sidewall 26 in the recess 35 in the bottom portion 212b. Hence, each spacer feature 89 can have, e.g., a convex surface abutting the sidewall 26 in the recess 35, and can have a conformal thickness along the sidewall 26 in the recess 35.

Figure 10C:
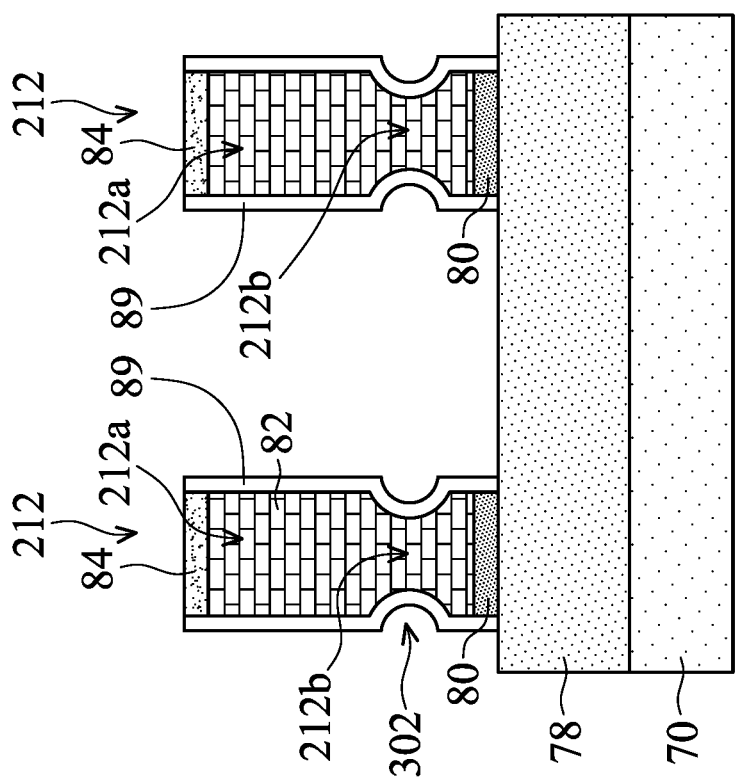

At operation 116, recesses 90 are formed in the substrate 70 for source/drain structures, as shown in FIGS. 10A-10C.

As illustrated, the recesses 90 are formed in the fin structure 74 on opposing sides of the dummy gate structure 212. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

It is noted that the etching process may selectively etch the fin structure 74 on the substrate 70 with minimum damage to the spacer feature 89. Thus, when recesses 90 are formed in the substrate 70, at least a portion of the fin structure 74 is removed between the isolation structures 78, as shown in FIG. 10B.

Figure 11B:
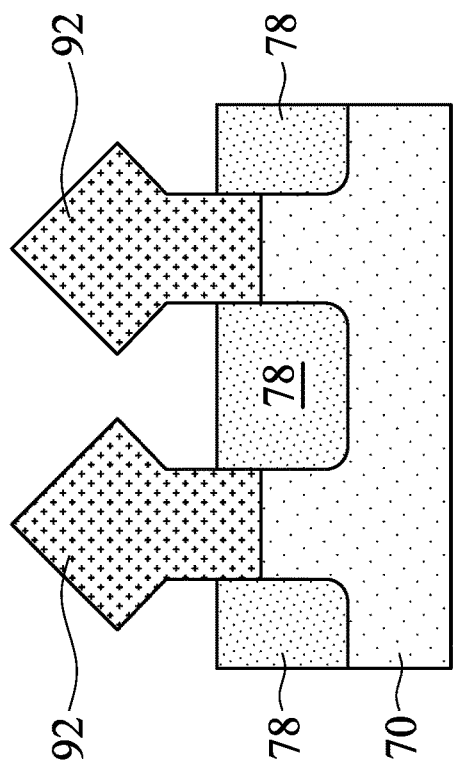
Figure 11A:
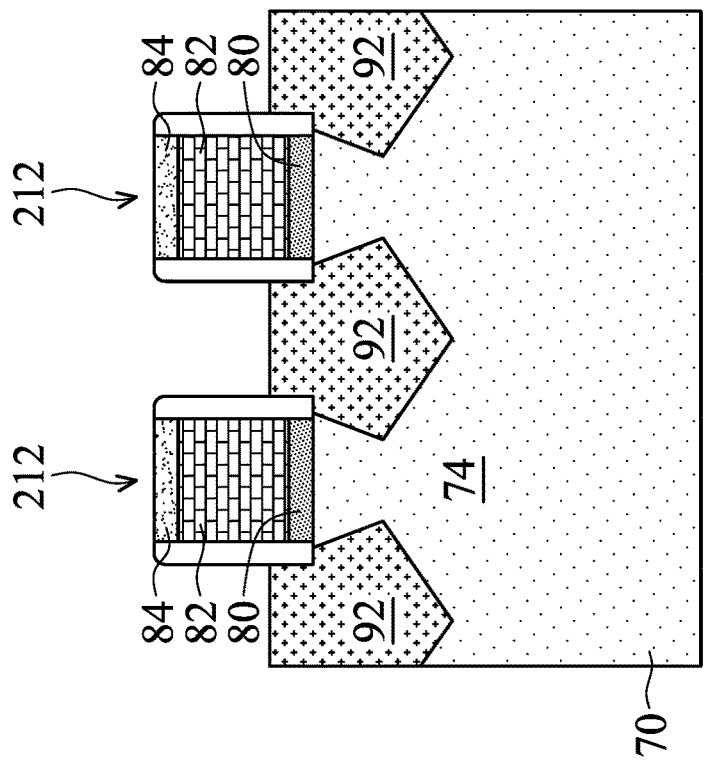
Figure 11C:
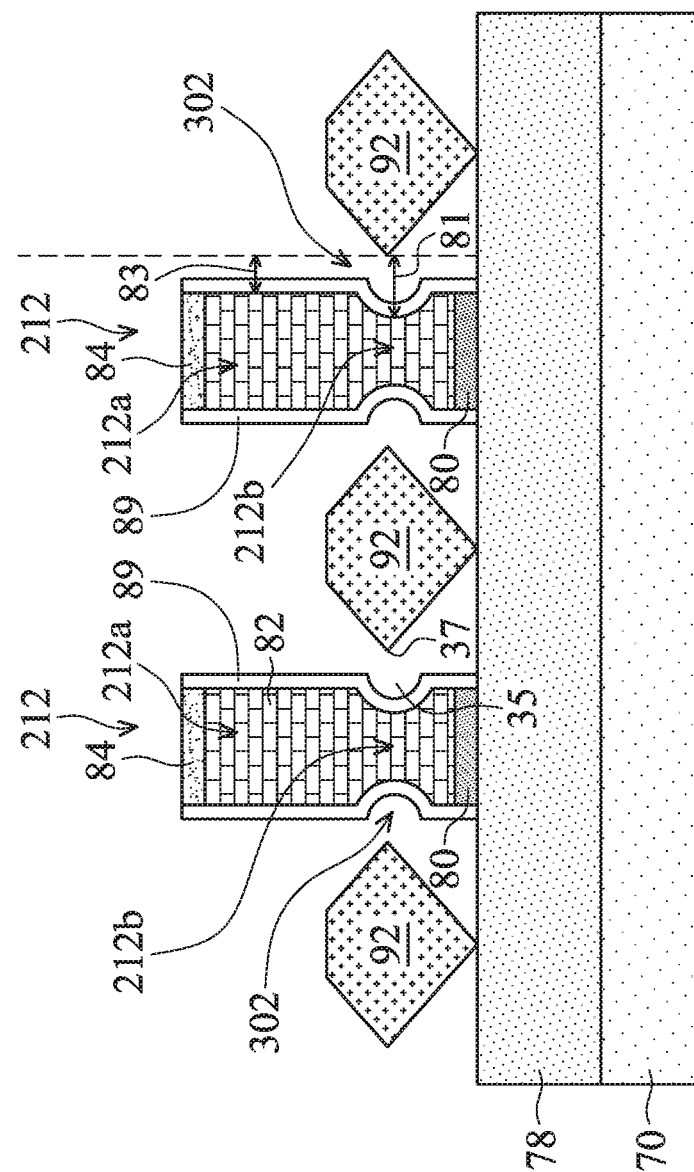

At operation 118, after the recesses 90 are formed in the substrate 70, an epitaxial deposition process may be performed to grow source/drain structures 92, as shown in FIGS. 11A-11C. The epitaxy source/drain structures 92 may include or be silicon germanium, silicon carbide, silicon phosphorus, germanium, a III-V compound semiconductor, a II-VI compound semiconductor, or the like. The epitaxy source/drain structures 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 11A-11C, due to blocking by the isolation structures 78, the epitaxy source/drain structures 92 are first grown vertically in recesses 90, during which time the epitaxy source/drain structures 92 do not grow horizontally. After the recesses 90 are fully filled, the epitaxy source/drain structures 92 may grow both vertically and horizontally to form facets, which may correspond to crystalline planes of the semiconductor substrate 70. In some examples, different materials are used for epitaxy source/drain structures for p-type devices and n-type devices. Appropriate masking during the recessing or epitaxial growth may permit different materials to be used in different devices.

As discussed above, due to the non-linear surface 302 formed in the dummy gate structure 212, contact of the tip 37 of the facets from the source/drain structures 92 with the spacer feature 89 along the dummy gate structure 212 may be avoided so as to maintain the intact growth of the source/drain structures 92 without altering morphology and shape of the source/drain structures 92. Overly close proximity between the source/drain structures 92 and the dummy gate structure 212, which will be later replaced with a replacement gate structure, may result in current leakage, a short circuit, or other electrical device defects. Thus, maintaining a desired space/distance, such as by the recess 35, between the gate structure and the source/drain structures 92 permit a desired electrical performance of the semiconductor devices. Hence, by forming the non-linear surface 302 at the bottom portion 212b of the dummy gate structure 212, the recess 35 defined thereby can increase and enlarge the distance between the dummy gate structure 212 and the tip 37 of the facets from the source/drain structures 92, which can avoid direct contact there between and can provide a wider process window during the epitaxial growth of the source/drain structures 92. In some examples, with the assistance of the recess 35 defined in the non-linear surface 302, the distance 81 between the sidewall 26 of the non-linear surface 302 to the tip 37 of the source/drain structures 92 is in a range from about 5% to about 30% greater than the distance 83 without the non-linear surface 302 (e.g., or the recess 35). Thus, the tip 37 may be allowed to extend further toward the recess 35 without being in contact with the gate structure.

In some examples, the epitaxy source/drain structures 92 may also be doped, such as by in-situ doping during epitaxial growth and/or by implanting dopants into the epitaxy source/drain structures 92 after epitaxial growth. Example dopants can include or be, for example, boron for a p-type device and phosphorus or arsenic for an n-type device, although other dopants may be used. The epitaxy source/drain structures 92 (or other source/drain structures) may have a dopant concentration in a range from about $10^{19}$ cm$^{-3}$ to about $10^{21}$ cm$^{-3}$. Hence, a source/drain structure may be delineated by doping (e.g., by implantation and/or in situ during epitaxial growth, if appropriate) and/or by epitaxial growth, if appropriate, which may further delineate the active area in which the source/drain structure is delineated.

Figure 12B:
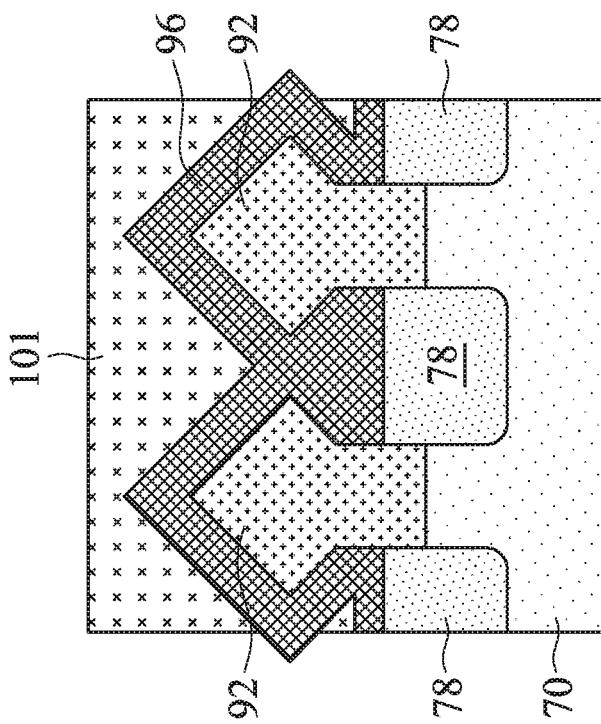
Figure 12A:
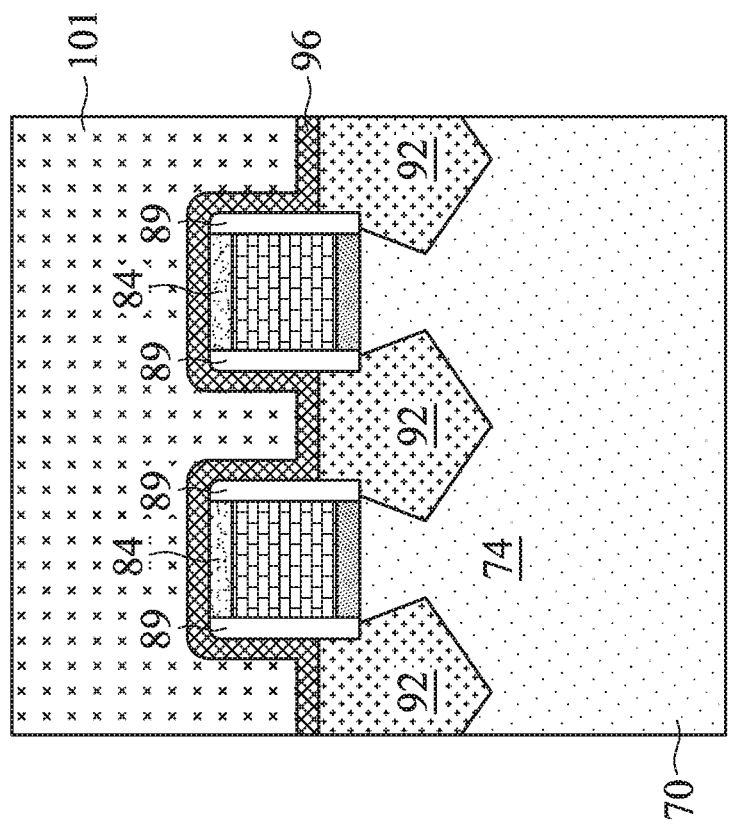
Figure 12C:
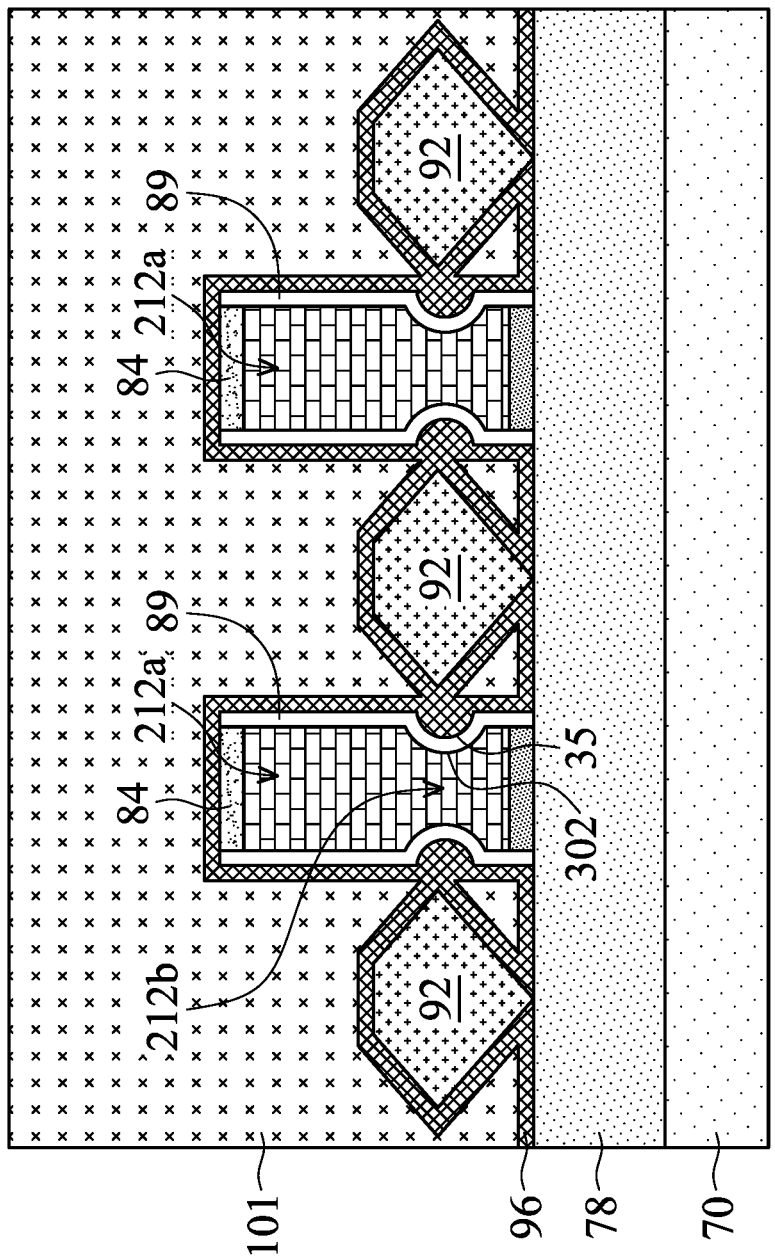

At operation 120, a contact etching stop layer (CESL) 96 is formed covering the dummy gate structure 212, as shown in FIGS. 12A-12C. The CESL 96 can provide a mechanism to stop an etch process when forming, e.g., contacts or vias. The contact etch stop layer 96 may be formed of a dielectric material having a different etch selectivity from adjacent layers or components. The CESL 96 is formed on surfaces of the epitaxy source/drain structures 92, sidewalls and top surfaces of the spacer feature 89, top surfaces of the hard mask 84, and top surfaces of the isolation structures 78. The CESL 96 may comprise or may be a nitrogen containing material, a silicon containing material, and/or a carbon containing material. Furthermore the CESL 96 may comprise or may be silicon nitride, silicon carbon nitride, carbon nitride, silicon oxynitride, silicon carbon oxide, the like, or a combination thereof. The CESL 96 may be deposited by a deposition process, such as a Plasma Enhanced ALD (PEALD), CVD, or another deposition technique.

At operation 122, an ILD layer 101 is formed over the CESL 96, as shown in FIGS. 12A-12C. The ILD layer 101 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), SiO$_x$C$_y$, Spin-On-Glass, Spin-On-Polymers, silicon carbon material, a compound thereof, a composite thereof, and/or other suitable dielectric materials. The ILD layer 101 may be deposited by a spin-on, CVD, FCVD, PECVD, PVD, or other suitable deposition technique. The ILD layer 101 may be planarized, such as by a CMP, to provide a planar surface as needed.

Figure 13C:
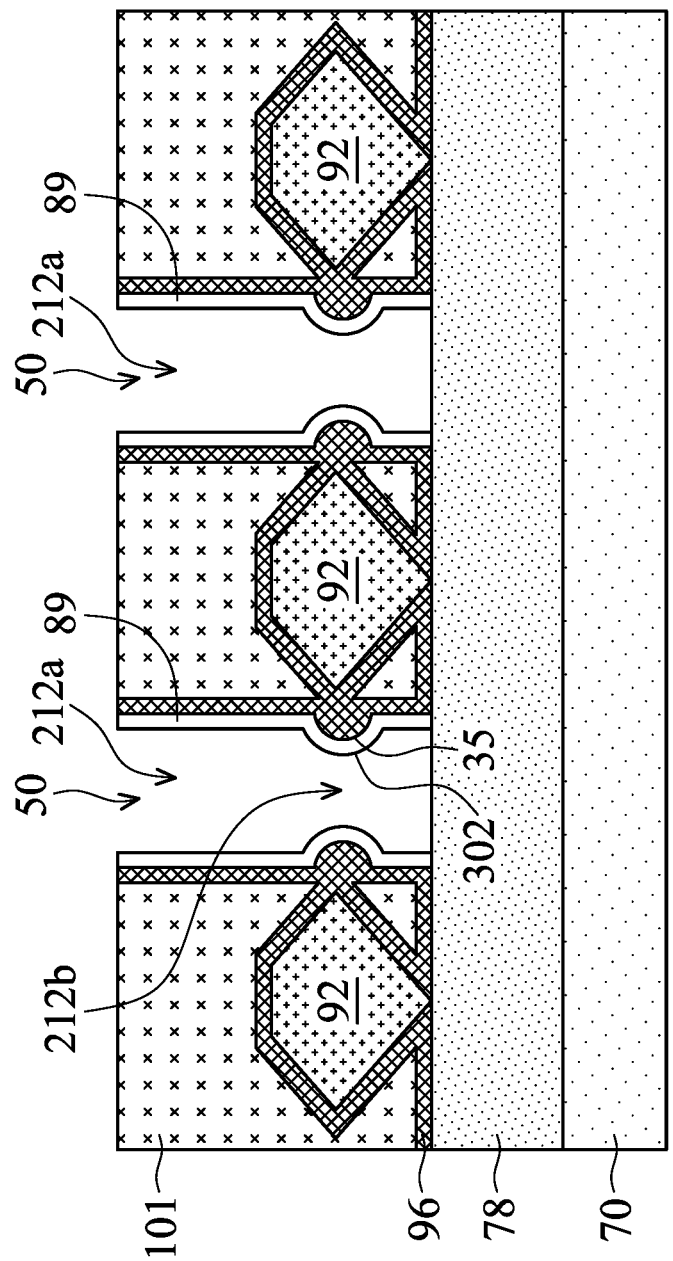
Figure 14A:
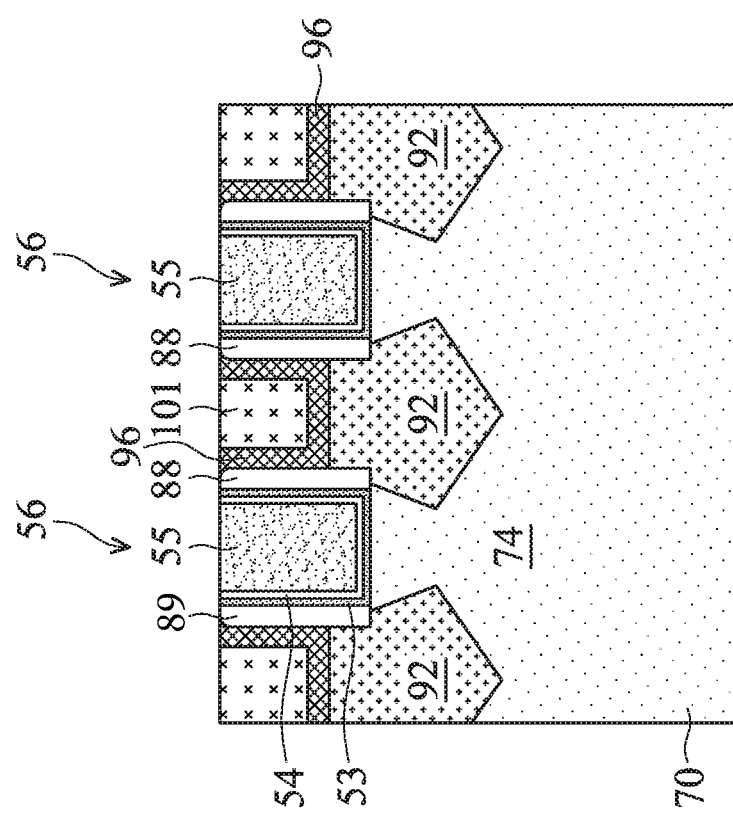
Figure 14B:
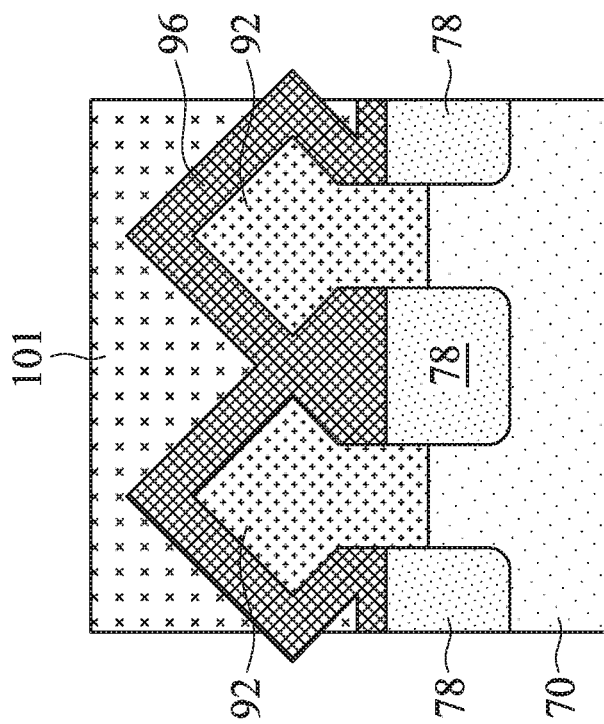
Figure 14C:
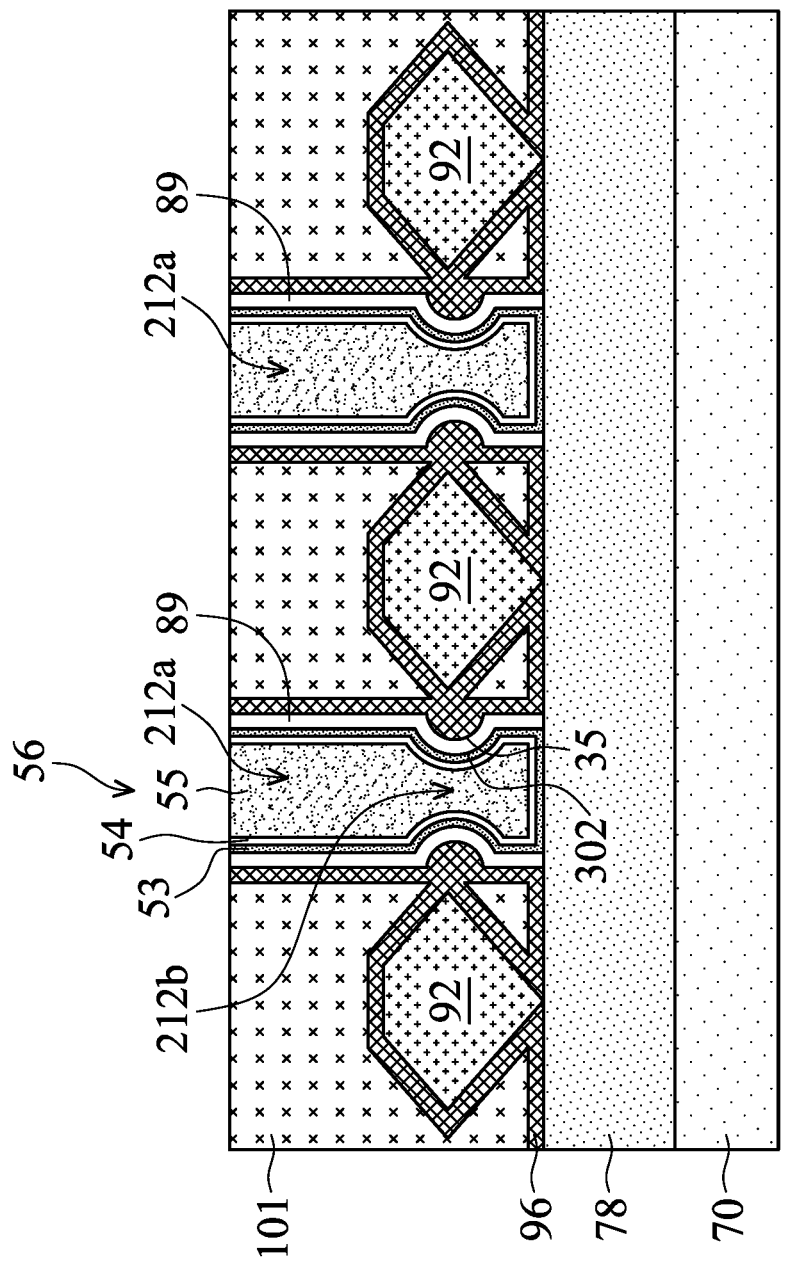

At operation 124, subsequently, the dummy gate structure 212 is removed from the substrate 70 to define an opening 50 between the spacer features 89 and in the ILD layer 101 as depicted in FIGS. 13A-13C, which may later allow a replacement gate structure 56, such as a metal gate structure, to be formed therein to continue manufacturing the semiconductor device structure 201, as shown in FIGS. 14A-14C. Referring back to FIGS. 13A-13C, one or more etching processes can be performed to remove the dummy gate structure 212. In some examples, an ashing process and/or a de-scum process may be performed to remove etching residuals from the substrate 70.

At operation 126, after the dummy gate structure 212 is removed, a replacement gate structure 56 is then formed in the opening 50. The replacement gate structure 56 may include an interfacial layer (not shown), a gate dielectric (e.g., high dielectric constant) layer 53, a work function tuning layer 54, and a metal fill structure 55 formed therein to form a replacement gate structure 56, as shown in FIGS. 14A-14C.

The interfacial layer (not shown) can be formed on surfaces of the fin structure 74 exposed by the respective opening 50. In some examples, the interfacial layer (not shown) may include a dielectric material such as silicon oxide ($SiO_2$), silicon oxynitride (SiON), or the like. The interfacial layer may be formed by chemical oxidation, thermal oxidation, ALD, CVD, and/or other suitable deposition processes. The gate dielectric layer 53 is formed conformally in the openings 50, such as on exposed surfaces of the fin structure 74 or on the interfacial layer and further along sidewalls of the spacer features 89 and over the ILD layer 101. The gate dielectric layer 53 can include a high-k dielectric constant material such as $HfO_2$, $Al_2O_3$, $LaO_2$, $TiO_2$, HfZrO, $Ta_2O_3$, $HfSiO_4$, $ZrO_2$, $ZrSiO_2$, a combination thereof, or another suitable material. The gate dielectric layer 53 may be formed by ALD, PECVD, and/or other suitable methods. It is noted that the gate dielectric layer 53 may be directly formed on the fin structure 74 when the interfacial layer is not present.

After the gate dielectric layer 53 is formed, the work function tuning layer 54 is formed conformally on the gate dielectric layer 53. The work function tuning layer 54 can tune the work function of the device. Suitable examples of the work function tuning layer 54 include Ti, TiN, TaN, TaAl, TaAlC, HfAl, TiAl, TiAlN, TaC, TaCN, TaSiN, Ru, Mo, Al, Ag, Mn, Zr, WN, $ZrSi_2$, $MoSi_2$, $TaSi_2$, $NiSi_2$, WN, other suitable metal materials, or a combination thereof. The work function tuning layer 54 may be formed by ALD, PECVD, and/or other suitable methods.

After the work function tuning layer 54 is formed, the metal fill structure 55 fills the openings 50, and after a planarization process, such as a CMP, is performed to remove excess materials, the replacement gate structures 56, as shown in FIGS. 14A-14C, are formed. The metal fill structure 55 is formed by CVD, PVD, plating, and/or other suitable processes. The metal fill structure 55 may include Al, W, or Cu and/or other suitable materials. Various other layers, such as barrier layers, capping layers, or the like, can be formed in the replacement gate structures 56.

As described, the gate dielectric layer 53, work function tuning layer 54, and any other conformal layer are deposited using a conformal deposition and form conformal layers in the replacement gate structures 56. Accordingly, the gate dielectric layer 53 conforms to the respective portions of the spacer features 89 that conformed to the non-linear surfaces 302 of the recesses 35 of the dummy gate layer 82. As such, the gate dielectric layer 53 has respective non-linear surfaces (e.g., hyperbolic surfaces) on outer lateral surfaces that correspond to the non-linear surfaces 302 of the recesses 35 of the dummy gate layer 82. The gate dielectric layer 53 has a conformal thickness along these non-linear surfaces. Similarly, the work function tuning layer 54 and any other conformal layer can be conformal to the gate dielectric layer 53 along non-linear surfaces.

Further, and more generally, the replacement gate structures 56 have profiles that correspond to the respective dummy gate structures 212. Hence, each replacement gate structure 56 can have a top portion that corresponds to the top portion 212a of the dummy gate structure 212, and can have a bottom portion that corresponds to the bottom portion 212b of the dummy gate structure 212. Each replacement gate structure 56 can have outer lateral sidewalls that correspond to the sidewalls 26, 27 (e.g., including the non-linear surfaces 302) of the dummy gate structure 212.

Although not intended to be limiting, one or more embodiments of the present disclosure may provide many benefits to a semiconductor device and the formation thereof. For example, embodiments of the present disclosure can provide methods for forming a gate structure with different profiles at different portions of the gate structure. The different profiles form in the gate structures can allow a different space/distance formed between the gate structures and the source/drain structures, providing a wider process window while growing the source/drain structures. As such, the electrical performance of the semiconductor devices may be modulated and adjusted to achieve desired electrical properties.

In an embodiment, a semiconductor device includes a fin structure on a substrate, a source/drain structure on the fin structure, and a gate structure over the fin structure and along a sidewall of the fin. The source/drain structure is proximate the gate structure. The gate structure has a top portion having a first sidewall profile and a bottom portion having a second sidewall profile different from the first sidewall profile. In an embodiment, the top portion of the gate structure is above a top surface of the fin structure, and the bottom portion is below the top surface of the fin structure. In an embodiment, the second sidewall profile comprises a non-linear surface. In an embodiment, a first lateral distance is between the non-linear surface of the second sidewall profile and the source/drain structure, and a second lateral distance is between the first sidewall profile and the source/drain structure, where the first lateral distance is greater than the second lateral distance. In an embodiment, the first lateral distance is greater than the second lateral distance by an amount in a range from 5% to 30% of the second lateral distance. In an embodiment, the non-linear surface comprises a hyperbolic surface, curvature surface, half-bulb/sphere-like surface, facet surface, necking surface, notching surface, or another surface. In an embodiment, the non-linear surface is below a top surface of the fin structure. In an embodiment, the top portion has a first width, and the bottom portion at the non-linear surface has a second width shorter than the first width. In an embodiment, the second width is in a range from 5% to 30% shorter than the first width. In an embodiment, a spacer feature is along a sidewall of the gate structure from the top portion extending to the bottom portion, and a contact etching stop layer is on the spacer feature. In an embodiment, an interlayer dielectric layer is on the contact etching stop layer. In an embodiment, the gate structure includes a metal fill structure disposed on a high dielectric constant layer.

In another embodiment, a semiconductor device includes a fin structure on a substrate, a gate structure over the fin structure, and spacer features each on a respective opposing sidewall of the gate structure, wherein each of the spacer features has a top portion and a lower portion on the respective opposing sidewall of the gate structure, wherein the lower portion of each of the spacer features has a non-linear surface laterally inward from a side surface of the top portion of the respective spacer feature, wherein the side surface of the top portion of the respective spacer feature is distal from the gate structure, and wherein the lower portion of each of the spacer features has a height below a top surface of the fin structure. In an embodiment, the semiconductor device further includes source/drain structures on the fin structure, wherein each of the source/drain structures is on an opposing side of the gate structure, wherein a tip of each of the source/drain structures extends towards the non-linear surface of the lower portion of the respective spacer feature. In an embodiment, the spacer features each have a uniform thickness from the top portion to the lower portion. In an embodiment, a first distance defined between the spacer features at the respective lower portions is shorter than a second distance defined between the spacer features at the respective top portions.

In yet another embodiment, a method for manufacturing semiconductor devices includes supplying a first etching gas mixture to anisotropically etch a top portion of a gate structure, and forming a non-linear surface on a sidewall of a bottom portion of the gate structure. Forming the non-linear surface includes supplying a second etching gas mixture to laterally etch the bottom portion of the gate structure. In an embodiment, the first and the second etching mixture includes a halogen containing gas, a bromide containing gas, and an oxygen containing gas or a nitrogen containing gas. In an embodiment, a ratio of the bromide containing gas to the halogen containing gas in the second etching gas mixture is less than a ratio of the bromide containing gas to the halogen containing gas the first etching gas mixture. In an embodiment, the top portion has a first width, and the bottom portion at the non-linear surface has a second width shorter than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin structure on a substrate;
a source/drain structure on the fin structure; and
a gate structure over the fin structure and along a sidewall of the fin structure, the source/drain structure being proximate the gate structure, the gate structure having a top portion having a first sidewall profile, a middle portion having a second sidewall profile, and a bottom portion having a third sidewall profile, wherein the first and third sidewall profiles are collinear, the bottom portion being at least as wide as the top portion, the first and third sidewall profiles being linear profiles, the second sidewall profile being a non-linear profile.

2. The semiconductor device of claim 1, wherein the top portion of the gate structure is above a top surface of the fin structure, and the bottom portion is below the top surface of the fin structure.

3. The semiconductor device of claim 1, wherein a first lateral distance is between the non-linear surface of the second sidewall profile and the source/drain structure, and a second lateral distance is between the first sidewall profile and the source/drain structure, the first lateral distance being greater than the second lateral distance.

4. The semiconductor device of claim 3, wherein the first lateral distance is greater than the second lateral distance by an amount in a range from 5% to 30% of the second lateral distance.

5. The semiconductor device of claim 1, wherein the non-linear surface comprises a hyperbolic surface, curvature surface, half-bulb/sphere-like surface, facet surface, necking surface, or notching surface.

6. The semiconductor device of claim 1, wherein the non-linear surface is below a top surface of the fin structure.

7. The semiconductor device of claim 1, wherein the top portion has a first width, and the middle portion at the non-linear surface has a second width shorter than the first width.

8. The semiconductor device of claim 7, wherein the second width is in a range from 5% to 30% shorter than the first width.

9. The semiconductor device of claim 1, further comprising:
a spacer feature along a sidewall of the gate structure from the top portion extending to the bottom portion; and
a contact etching stop layer on the spacer feature.

10. The semiconductor device of claim 9, further comprising:
an interlayer dielectric layer on the contact etching stop layer.

11. The semiconductor device of claim 1, wherein the gate structure comprises a metal fill structure disposed on a high dielectric constant layer.

12. A semiconductor device comprising:
a fin structure on a substrate;
a gate structure over the fin structure; and
respective spacer features a respective opposing sidewall of the gate structure, wherein each of the spacer features has a top portion and a lower portion on the respective opposing sidewall of the gate structure, wherein the lower portion of each of the spacer features has a continuously curving surface laterally inward from a side surface of the top portion of the respective spacer feature, wherein the side surface of the top portion of the respective spacer feature is distal from the gate structure, and wherein the lower portion of each of the spacer features has a height below a top surface of the fin structure.

13. The semiconductor device of claim 12 further comprising source/drain structures on the fin structure, wherein each of the source/drain structures is on an opposing side of the gate structure, wherein a tip of each of the source/drain structures extends towards the non-linear surface of the lower portion of the respective spacer feature.

14. The semiconductor device of claim 12, wherein the spacer features each have a uniform thickness from the top portion to the lower portion.

15. The semiconductor device of claim 12, wherein a first distance defined between the spacer features at the respective lower portions is shorter than a second distance defined between the spacer features at the respective top portions.

16. The device of claim 12, wherein the non-linear surface is a curvilinear surface.

17. A device comprising:
a fin structure on a substrate;
a source/drain structure on the fin structure; and
a gate structure over the fin structure and along a sidewall of the fin structure, the source/drain structure being adjacent the gate structure, the gate structure having a top portion with a first linear sidewall surface, a middle portion having a non-linear sidewall surface, and a bottom portion having a second linear sidewall surface, the first linear sidewall surface and the second linear sidewall surface being collinear.

18. The device of claim 17, wherein the top portion of the gate structure is above a top surface of the fin structure, and the bottom portion is below the top surface of the fin structure.

19. The device of claim 17, wherein the non-linear sidewall surface comprises a hyperbolic surface, curvature surface, half-bulb/sphere-like surface, facet surface, necking surface, or notching surface.

20. The device of claim 17, wherein the bottom portion being at least as wide as the top portion.

\* \* \* \* \*

UNITED STATES PATENT AND TRADEMARK OFFICE
CERTIFICATE OF CORRECTION

| | |
|---|---|
| PATENT NO. | : 11,605,719 B2 |
| APPLICATION NO. | : 16/992899 |
| DATED | : March 14, 2023 |
| INVENTOR(S) | : Chih Ping Wang et al. |

It is certified that error appears in the above-identified patent and that said Letters Patent is hereby corrected as shown below:

In the Claims

Claim 12, Column 14, Line 26; delete "a respective" and insert --on respective--.

Signed and Sealed this
Eleventh Day of April, 2023

Katherine Kelly Vidal
*Director of the United States Patent and Trademark Office*